(12) United States Patent
Jung et al.

(10) Patent No.: US 12,170,119 B2
(45) Date of Patent: Dec. 17, 2024

(54) MEMORY DEVICE FOR PERFORMING PROGRAM OPERATION AND METHOD OF OPERATING THE SAME

(71) Applicant: SK hynix Inc., Gyeonggi-do (KR)

(72) Inventors: Jae Yeop Jung, Gyeonggi-do (KR); Dong Hun Kwak, Gyeonggi-do (KR); Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 283 days.

(21) Appl. No.: 17/829,876

(22) Filed: Jun. 1, 2022

(65) Prior Publication Data

US 2023/0015493 A1 Jan. 19, 2023

(30) Foreign Application Priority Data

Jul. 13, 2021 (KR) .......................... 10-2021-0091838
Dec. 28, 2021 (KR) .......................... 10-2021-0190111

(51) Int. Cl.
*G11C 16/00* (2006.01)
*G11C 16/10* (2006.01)
*G11C 16/16* (2006.01)
*G11C 16/34* (2006.01)

(52) U.S. Cl.
CPC .......... *G11C 16/3427* (2013.01); *G11C 16/10* (2013.01); *G11C 16/16* (2013.01); *G11C 16/3459* (2013.01)

(58) Field of Classification Search
CPC . G11C 16/0483; G11C 16/3459; G11C 16/08; G11C 16/10; G11C 16/24; G11C 16/32; G11C 16/16; G11C 8/08; G11C 16/30; G11C 16/12; G11C 16/3427; G11C 16/3445; G11C 7/14; G11C 11/5628; G11C 11/5671; G11C 16/26; G11C 16/3418; G11C 2211/5642; G11C 16/0466; G11C 16/14; G11C 16/34; G11C 16/3413; G11C 16/3431; G11C 16/349; G11C 2029/1202; G11C 29/025; G11C 29/50;

(Continued)

(56) References Cited

U.S. PATENT DOCUMENTS 9,973,301 B2 * 5/2018 Raza ..................... H03M 13/37
11,282,583 B2 * 3/2022 Kim .................. G11C 16/3418

FOREIGN PATENT DOCUMENTS

KR 10-2009-0080588 A 7/2009
KR 10-2014-0104730 A 8/2014
KR 10-2015-0091665 A 8/2015

* cited by examiner

Primary Examiner — Thong Q Le
(74) Attorney, Agent, or Firm — IP & T GROUP LLP

(57) ABSTRACT

Provided herein may be a memory device and a method of operating the same. The memory device may include a plurality of memory cells coupled between a common source line and a bit line, a peripheral circuit configured to perform a plurality of program loops, each including a program voltage application operation of applying a program voltage to a selected memory cell and a verify operation of verifying a program state of the selected memory cell, and a control logic configured to control, at the program voltage application operation, the peripheral circuit to apply a precharge voltage to the common source line and change at least one of a magnitude of the precharge voltage and a time during which the precharge voltage is applied, depending on a magnitude of the program voltage.

20 Claims, 25 Drawing Sheets

(58) Field of Classification Search
CPC ..... G11C 29/50004; G11C 7/12; G11C 16/04; G11C 16/3404; G11C 2211/5648; G11C 5/14
See application file for complete search history.

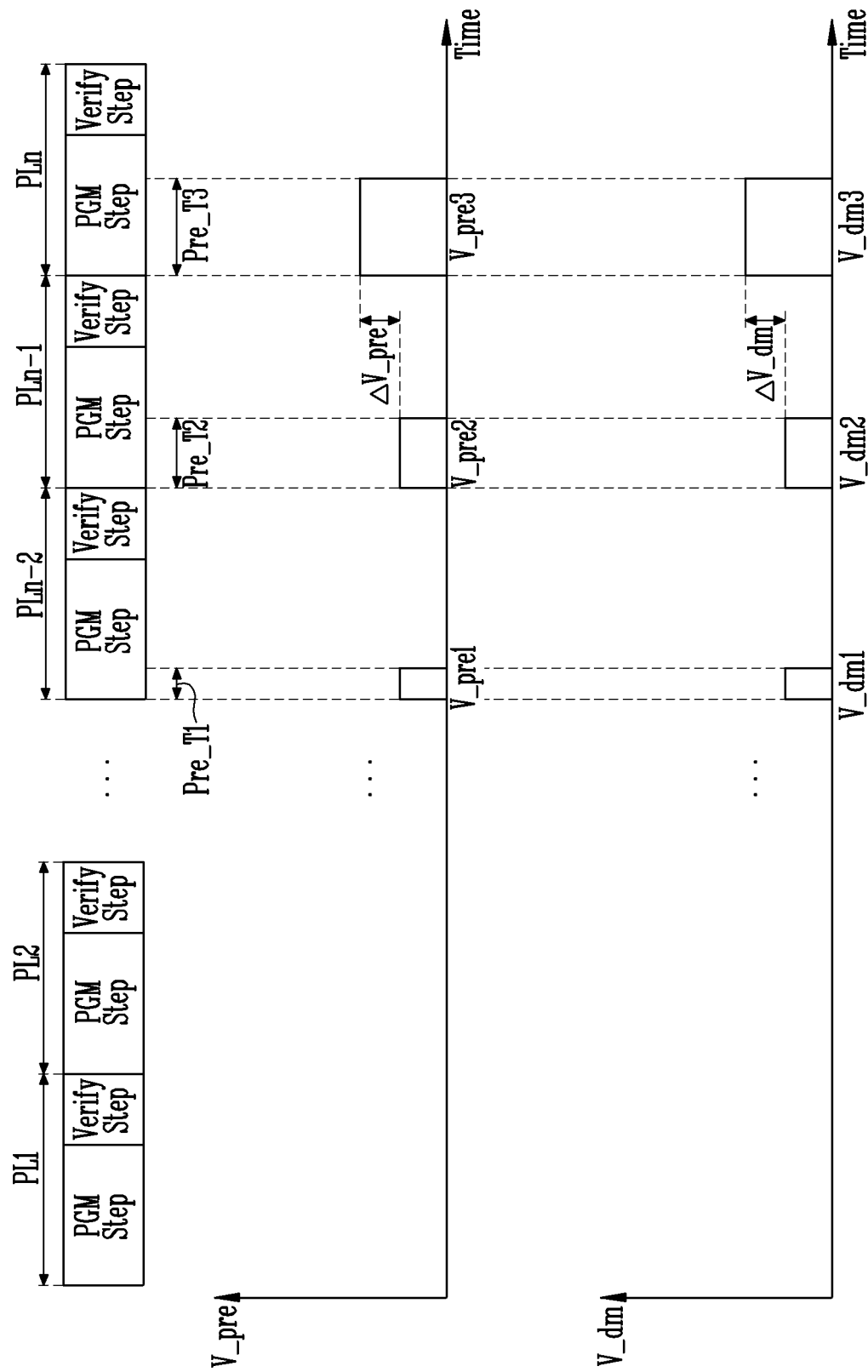

MEMORY DEVICE FOR PERFORMING PROGRAM OPERATION AND METHOD OF OPERATING THE SAME

CROSS-REFERENCE TO RELATED APPLICATION

The present application claims priority under 35 U.S.C. § 119(a) to Korean patent application number 10-2021-0091838, filed on Jul. 13, 2021 and Korean patent application number 10-2021-0190111, filed on Dec. 28, 2021, in the Korean Intellectual Property Office, the entire disclosures of which are incorporated herein by reference.

BACKGROUND

1. Field of Invention

Various embodiments of the present disclosure relate to an electronic device, and more particularly to a memory device for performing a program operation and a method of operating the memory device.

2. Description of Related Art

Memory devices are storage devices implemented using a semiconductor such as silicon (Si), germanium (Ge), gallium arsenide (GaAs), or indium phosphide (InP). Memory devices are basically classified into a volatile memory device and a nonvolatile memory device.

The volatile memory device is a memory device in which stored data is lost when power supply is interrupted. Representative examples of the volatile memory device include a static random access memory (SRAM), a dynamic RAM (DRAM), and a synchronous DRAM (SDRAM). The nonvolatile memory device is a memory device in which stored data is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change RAM (PRAM), a magnetic RAM (MRAM), a resistive RAM (RRAM), and a ferroelectric RAM (FRAM). The flash memory is basically classified into a NOR type and a NAND type.

SUMMARY

Various embodiments of the present disclosure are directed to a memory device for performing a program operation, which can improve a disturbance phenomenon occurring during the program operation, and a method of operating the memory device.

An embodiment of the present disclosure may provide for a memory device. The memory device may include a plurality of memory cells coupled between a common source line and a bit line, a peripheral circuit configured to perform a plurality of program loops, each including a program voltage application operation of applying a program voltage to a memory cell selected from among the plurality of memory cells and a verify operation of verifying a program state of the selected memory cell, and a control logic configured to control, at the program voltage application operation, the peripheral circuit to apply a precharge voltage to the common source line and change at least one of a magnitude of the precharge voltage and a time during which the precharge voltage is applied to the common source line, depending on a magnitude of the program voltage.

An embodiment of the present disclosure may provide for a memory device. The memory device may include a plurality of memory cell strings, each including a plurality of memory cells coupled between a common source line and a bit line, and a plurality of dummy memory cells coupled between the plurality of memory cells and the common source line, a peripheral circuit configured to perform a plurality of program loops, each program loop including a program voltage application operation of applying a program voltage to a memory cell selected from among the plurality of memory cells and a verify operation of verifying program states of the selected memory cells, and a control logic configured to control, at the program voltage application operation, the peripheral circuit to apply a precharge voltage to the common source line, apply a dummy voltage to at least one of a plurality of dummy word lines respectively coupled to the plurality of dummy memory cells, and change at least one of a magnitude of the dummy voltage and a time during which the dummy voltage is applied to the at least one dummy word lone depending on a magnitude of the program voltage.

An embodiment of the present disclosure may provide for a method of operating a memory device including a plurality of memory cell strings, each including a plurality of memory cells coupled between a common source line and a bit line, a source select line coupled between the common source line and the plurality of memory cells, a drain select line coupled between the bit line and the plurality of memory cells, and a plurality of dummy memory cells coupled between the plurality of memory cells and the source select line. The method may include applying a first precharge voltage to the common source line in a first program loop among a plurality of program loops, applying a first dummy voltage to at least one of a plurality of dummy word lines respectively coupled to the plurality of dummy memory cells in the first program loop, applying a second precharge voltage higher than the first precharge voltage in a second program loop after the first program loop, among the plurality of program loops, and applying a second dummy voltage higher than the first dummy voltage to the at least one dummy word line in the second program loop.

An embodiment of the present disclosure may provide for a memory device. The memory device may include a memory cell array of rows and columns, the rows including first rows and a control circuit configured to perform program loops each including applying a precharge voltage to the columns, and applying a program voltage to a selected row of the first rows, wherein each of the precharge voltage and the program voltage increases stepwise as the program loops proceed.

BRIEF DESCRIPTION OF THE DRAWINGS

FIG. 12 is a diagram for describing an operation of changing at least one of the magnitude of a precharge voltage, the time during which the precharge voltage is applied, the magnitude of a dummy voltage, and the time during which the dummy voltage is applied depending on the magnitude of a program voltage in a program operation of a memory device according to an embodiment of the present disclosure.

DETAILED DESCRIPTION

Specific structural or functional descriptions of the embodiments of the present disclosure introduced in this specification describe the embodiments according to the concept of the present disclosure. The embodiments according to the concept of the present disclosure may be practiced in various forms, and should not be construed as being limited to the embodiments described in the specification.

Figure 1:
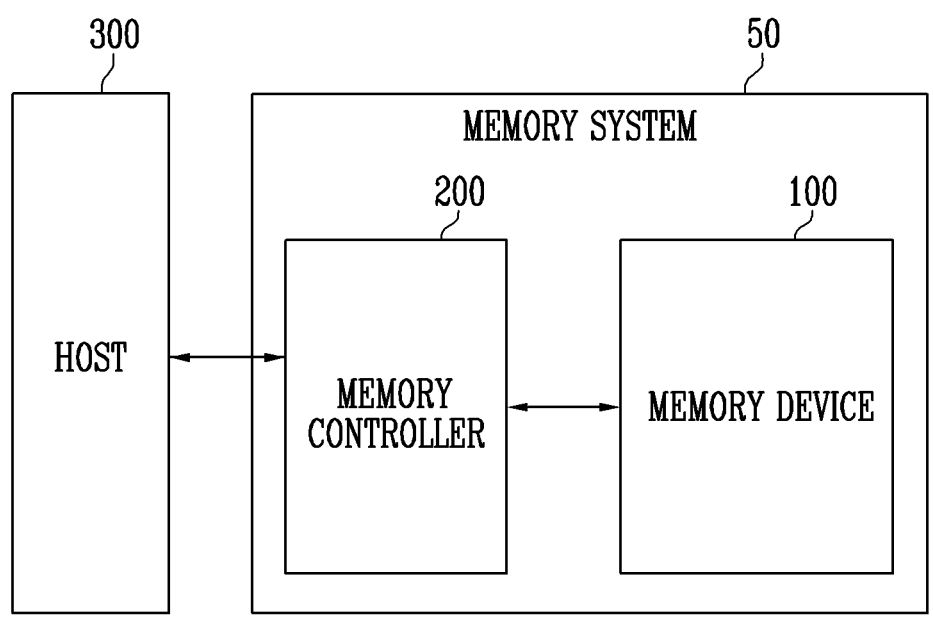
FIG. 1 is a diagram illustrating a memory system including a memory device according to an embodiment of the present disclosure.

FIG. 1 is a diagram illustrating a memory system including a memory device according to an embodiment of the present disclosure.

Referring to FIG. 1, a memory system 50 may include a memory device 100 and a memory controller 200. The memory system 50 may be a device which stores data under the control of a host 300, such as a mobile phone, a smartphone, an MP3 player, a laptop computer, a desktop computer, a game console, a TV, a tablet PC, or an in-vehicle infotainment system.

The memory system 50 may be manufactured as any of various types of storage devices depending on a host interface that is a scheme for communication with the host 300. For example, the memory system 50 may be implemented as any of various types of storage devices, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-e or PCIe) card-type storage device, a compact flash (CF) card, a smart media card, and a memory stick.

The memory system 50 may be manufactured in any of various types of package forms. For example, the memory system 50 may be manufactured in any of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 may be operated in response to the control of the memory controller 200. The memory device 100 may include a memory cell array (not illustrated) including a plurality of memory cells which store data.

Each of the memory cells may be implemented as a single-level cell (SLC) capable of storing one bit of data, a multi-level cell (MLC) capable of storing two bits of data, a triple-level cell (TLC) capable of storing three bits of data, or a quad-level cell (QLC) capable of storing four bits of data.

The memory cell array (not illustrated) may include a plurality of memory blocks. Each memory block may include a plurality of memory cells. A single memory block may include a plurality of pages. In an embodiment, a page may be a unit by which data is stored in the memory device 100 or by which data stored in the memory device 100 is read. A memory block may be a unit by which data is erased.

In an embodiment, the memory device 100 may be implemented as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change RAM (PRAM), a magnetoresistive RAM (MRAM), a ferroelectric RAM (FRAM), or a spin transfer torque RAM (STT-RAM). In the present specification, for convenience of description, a description is made based on the memory device 100 being a NAND flash memory.

The memory device 100 may receive a command and an address from the memory controller 200, and may access the area of the memory cell array, selected by the address. The memory device 100 may perform an operation indicated by the command on the area selected by the address. For example, the memory device 100 may perform a write operation (i.e., a program operation), a read operation, and an erase operation. During a write operation, the memory device 100 may program data to the area selected by the address. During a read operation, the memory device 100 may read data from the area selected by the address. During an erase operation, the memory device 100 may erase data stored in the area selected by the address.

The memory controller 200 may control the overall operation of the memory system 50.

When power is applied to the memory system 50, the memory controller 200 may run firmware (FW). When the memory device 100 is a flash memory device, the firmware (FW) may include a host interface layer (HIL) which controls communication with the host 300, a flash translation layer (FTL) which controls communication between the host 300 and the memory device 100, and a flash interface layer (FIL) which controls communication with the memory device 100.

In an embodiment, the memory controller 200 may receive data and a logical block address (LBA) from the host 300, and may translate the logical block address (LBA) into a physical block address (PBA) indicating the address of memory cells which are included in the memory device 100 and in which data is to be stored. In the present specification, the terms "logical block address (LBA)" and "logical address" may be used interchangeably. In the present specification, the terms "physical block address (PBA)" and "physical address" may be used interchangeably.

The memory controller 200 may control the memory device 100 so that a write operation, a read operation or an erase operation is performed in response to a request received from the host 300. During a write operation, the memory controller 200 may provide a write command, a physical block address, and data to the memory device 100.

During a read operation, the memory controller 200 may provide a read command and a physical block address to the memory device 100. During an erase operation, the memory controller 200 may provide an erase command and a physical block address to the memory device 100.

In an embodiment, the memory controller 200 may autonomously generate a command, an address, and data regardless of whether a request from the host 300 is received, and may transmit the command, address, and data to the memory device 100. For example, the memory controller 200 may provide the memory device 100 with commands, addresses, and data required in order to perform read operations and write operations that are involved in performing wear leveling, read reclaim, garbage collection, etc.

In an embodiment, the memory controller 200 may control at least two memory devices 100. In this case, the memory controller 200 may control the memory devices 100 depending on an interleaving scheme to improve operating performance. The interleaving scheme may be a scheme for controlling the memory devices 100 so that the operations of at least two memory devices 100 are caused to overlap each other.

The host 300 may communicate with the memory system 50 using at least one of various communication methods such as universal serial bus (USB), Serial AT Attachment (SATA), serial attached SCSI (SAS), high speed interchip (HSIC), small computer system interface (SCSI), peripheral component interconnection (PCI), PCI express (PCIe), nonvolatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
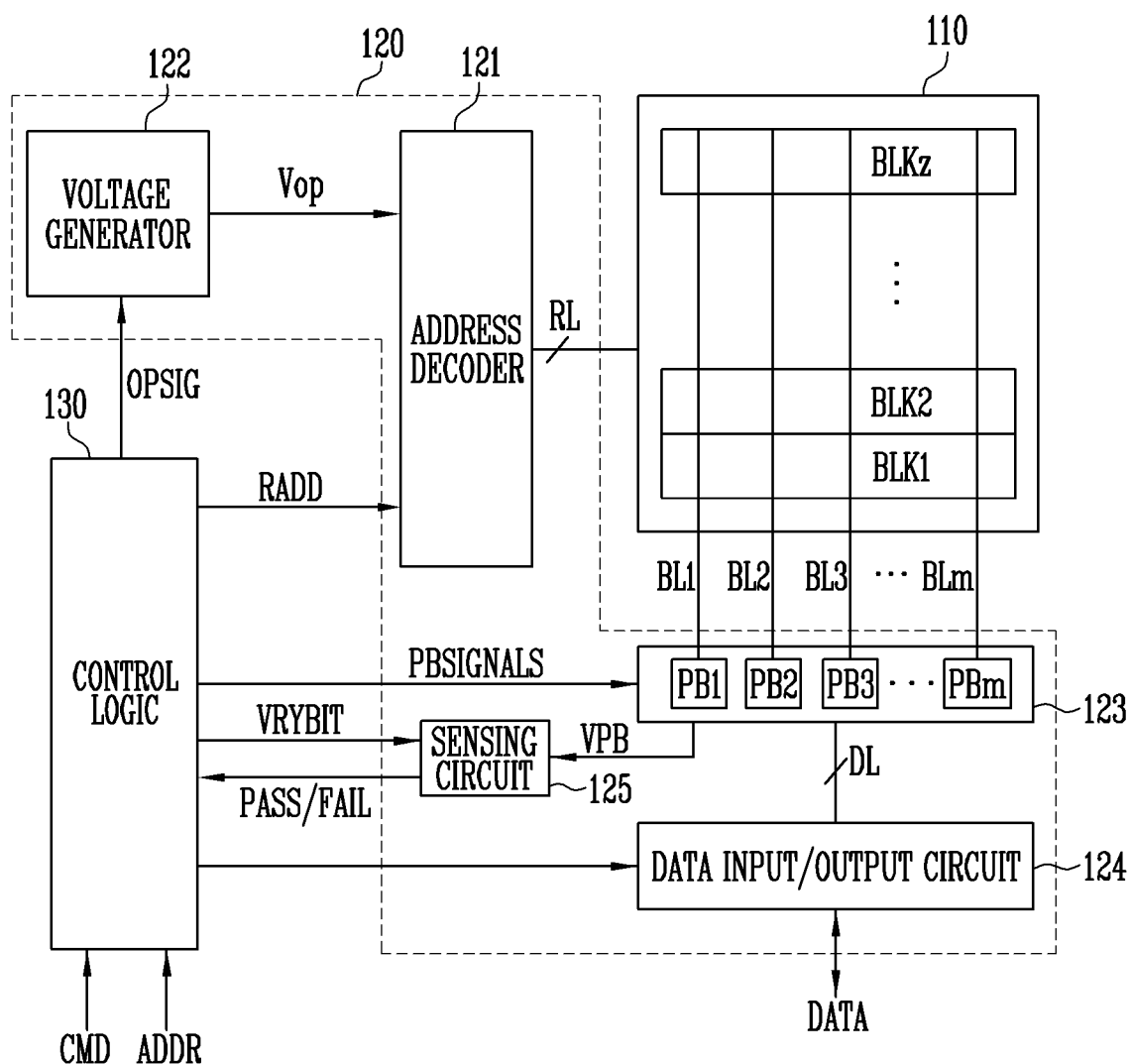
FIG. 2 is a diagram illustrating the structure of the memory device of FIG. 1 according to an embodiment of the present disclosure.

FIG. 2 is a diagram illustrating the structure of the memory device of FIG. 1 according to an embodiment of the present disclosure.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz may be coupled to an address decoder 121 through row lines RL. The memory blocks BLK1 to BLKz are coupled to a page buffer group 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line among the plurality of memory cells are defined as one page. Namely, the memory cell array 110 may include a plurality of pages. In an embodiment of the present disclosure, each of the memory blocks BLK1 to BLKz included in the memory cell array 110 may include a plurality of dummy cells. For the dummy cells, one or more dummy cells may be coupled in series between a drain select transistor and memory cells and between a source select transistor and the memory cells.

Each of the memory cells of the memory device 100 may be implemented as a single-level cell (SLC) capable of storing one bit of data, a multi-level cell (MLC) capable of storing two bits of data, a triple-level cell (TLC) capable of storing three bits of data, or a quad-level cell (QLC) capable of storing four bits of data.

The peripheral circuit 120 may drive the memory cell array 110. In an example, the peripheral circuit 120 may drive the memory cell array 110 so that a program operation, a read operation, and an erase operation are performed under the control of the control logic 130. In other examples, the peripheral circuit 120 may apply various operating voltages to the row lines RL and the bit lines BL1 to BLm or discharge the applied voltages under the control of the control logic 130.

The peripheral circuit 120 may include the address decoder 121, a voltage generator 122, the page buffer group 123, a data input/output circuit 124, and a sensing circuit 125.

The address decoder 121 is coupled to the memory cell array 110 through the row lines RL. The row lines RL may include drain select lines, word lines, source selection lines, and a common source line. In accordance with an embodiment of the present disclosure, the word lines may include normal word lines and dummy word lines. In accordance with an embodiment, the row lines RL may further include a pipe select line.

The address decoder 121 may be operated under the control of the control logic 130. The address decoder 121 receives addresses ADDR from the control logic 130.

The address decoder 121 may decode a block address, among the received addresses ADDR. The address decoder 121 may select at least one of the memory blocks BLK1 to BLKz according to the decoded block address. The address decoder 121 may decode a row address RADD, among the received addresses ADDR. The address decoder 121 may select at least one word line WL of the selected memory block by applying voltages supplied from the voltage generator 122 to the at least one word line WL according to the decoded row address RADD.

During a program operation, the address decoder 121 may apply a program voltage to the selected word line and apply a pass voltage having a level lower than that of the program voltage to unselected word lines. During a program verify operation, the address decoder 121 may apply a verify voltage to the selected word line and apply a verify pass voltage having a level higher than that of the verify voltage to unselected word lines.

During a read operation, the address decoder 121 may apply a read voltage to the selected word line and apply a read pass voltage having a level higher than that of the read voltage to unselected word lines.

The erase operation of the memory device 100 is performed on a memory block basis. During the erase operation, the addresses ADDR input to the memory device 100 include a block address. The address decoder 121 may decode the block address and select one memory block according to the decoded block address. During the erase operation, the address decoder 121 may apply a ground voltage to word lines coupled to the selected memory block.

In accordance with an embodiment of the present disclosure, the address decoder 121 may decode a column address, among the received addresses ADDR. The decoded column address may be transferred to the page buffer group 123. In an embodiment, the address decoder 121 may include components such as a row decoder, a column decoder, and an address buffer.

The voltage generator 122 may generate a plurality of operating voltages Vop using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 may be used as an operating voltage for the memory device 100.

In an embodiment, the voltage generator 122 may generate various operating voltages Vop that are used for program, read, and erase operations in response to an operation signal OPSIG. The voltage generator 122 may generate the plurality of operating voltages Vop using the external supply voltage or the internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage to generate a plurality of operating voltages Vop having various voltage levels, and may generate the plurality of operating voltages Vop by selectively enabling the plurality of pumping capacitors under the control of the control logic 130.

The generated operating voltages Vop may be supplied to the memory cell array 110 by the address decoder 121.

The page buffer group 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm may transmit/receive data DATA to/from the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program pulse is applied to a selected word line. The memory cells in the selected page are programmed based on the received data DATA. Memory cells coupled to a bit line to which a program-enable voltage (e.g., a ground voltage) is applied may have increased threshold voltages. The threshold voltages of memory cells coupled to a bit line to which a program—inhibit voltage (e.g., a supply voltage) is applied may be maintained. During a program verify operation, the first to m-th page buffers PB1 to PBm read the data DATA stored in the selected memory cells from the selected memory cells through the bit lines BL1 to BLm.

During a read operation, the page buffer group 123 may read data DATA from the memory cells in the selected page through the bit lines BL1 to BLm, and may store the read data DATA in the first to m-th page buffers PB1 to PBm.

During an erase operation, the page buffer group 123 may allow the bit lines BL1 to BLm to float. In an embodiment, the page buffer group 123 may include a column select circuit.

In an embodiment, while pieces of data stored in some of the plurality of page buffers included in the page buffer group 123 are being programmed to the memory cell array 110, the remaining page buffers may receive new data from the memory controller 200 and then store the new data.

The data input/output circuit 124 is coupled to the first to m-th page buffers PB1 to PBm through the data lines DL. The data input/output circuit 124 is operated in response to the control of the control logic 130.

The data input/output circuit 124 may include a plurality of input/output buffers (not illustrated) which receive input data DATA. During a program operation, the data input/ output circuit 124 receives the data DATA to be stored from an external controller (not illustrated). During a read operation, the data input/output circuit 124 outputs the data DATA, received from the first to m-th page buffers PB1 to PBm included in the page buffer group 123, to the external controller.

During a read operation or a verify operation, the sensing circuit 125 may generate a reference current in response to an enable bit signal VRYBIT generated by the control logic 130, and may output a pass signal or a fail signal to the control logic 130 by comparing a sensing voltage VPB received from the page buffer group 123 with a reference voltage generated by the reference current.

The control logic 130 may be coupled to the address decoder 121, the voltage generator 122, the page buffer group 123, the data input/output circuit 124, and the sensing circuit 125. The control logic 130 may control the overall operation of the memory device 100. The control logic 130 may be operated in response to a command CMD transferred from an external device.

The control logic 130 may control the peripheral circuit 120 by generating various types of signals in response to the command CMD and the addresses ADDR. For example, the control logic 130 may generate the operation signal OPSIG, the row address RADD, page buffer control signals PBSIGNALS, and the enable bit VRYBIT in response to the command CMD and the addresses ADDR. The control logic 130 may output the operation signal OPSIG to the voltage generator 122, may output the row address RADD to the address decoder 121, may output the page buffer control signal PBSIGNALS to the page buffer group 123, and may output the enable bit VRYBIT to the sensing circuit 125. In addition, the control logic 130 may determine whether a verify operation has passed or failed in response to the pass or fail signal PASS or FAIL output from the sensing circuit 125.

Figure 3:
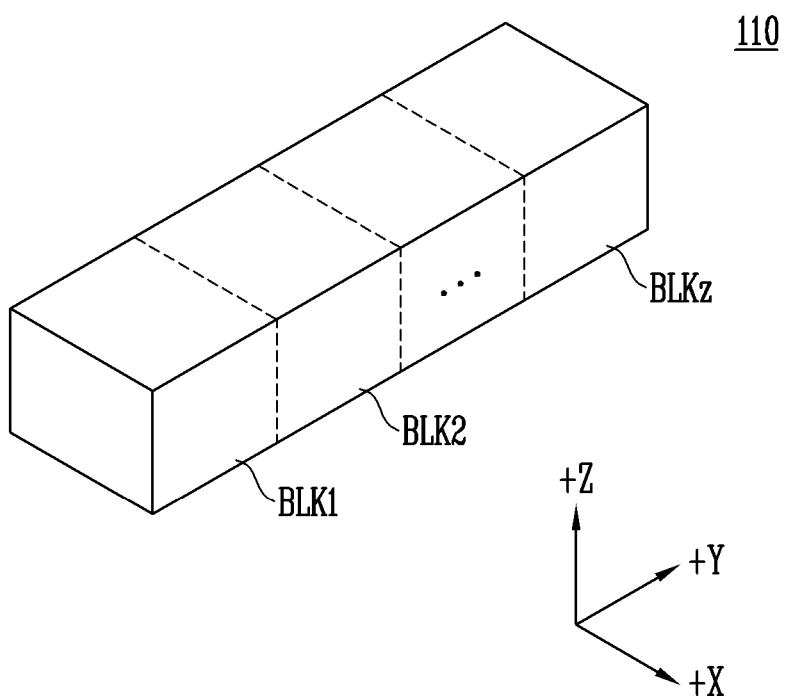
FIG. 3 is a diagram illustrating a memory cell array of FIG. 2 according to an embodiment of the present disclosure.

FIG. 3 is a diagram illustrating the memory cell array of FIG. 2 according to an embodiment of the present disclosure.

Referring to FIG. 3, the memory cell array 110 includes a plurality of memory blocks BLK1 to BLKz. Each of the memory blocks may have a three-dimensional (3D) structure. Each of the memory blocks may include a plurality of memory cells stacked on a substrate. The plurality of memory cells are arranged in +X, +Y, and +Z directions. The structure of each memory block will be described in greater detail below with reference to FIGS. 4 and 5.

Figure 4:
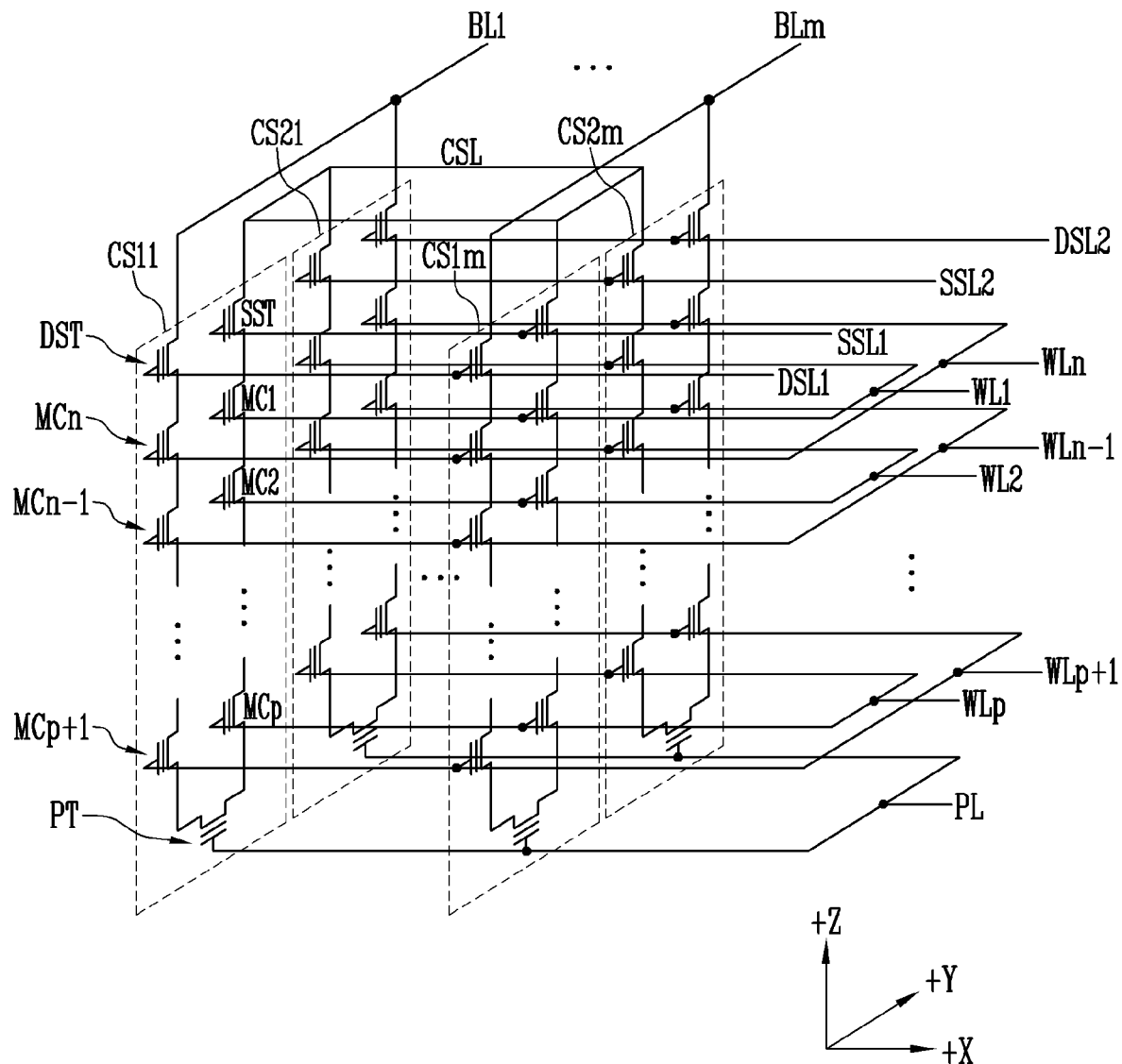
FIG. 4 is a circuit diagram illustrating a memory block BLKa of memory blocks BLK1 to BLKz of FIG. 3 according to an embodiment of the present disclosure.

FIG. 4 is a circuit diagram illustrating a memory block BLKa of memory blocks BLK1 to BLKz of FIG. 3 according to an embodiment of the present disclosure.

Referring to FIG. 4, the memory block BLKa includes a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings are arranged in a row direction (i.e., a positive (+) X direction). In FIG. 4, two cell strings are illustrated as being arranged in a column direction (i.e., a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and memory cells MC1 to MCp.

In an embodiment, the source select transistors of cell strings arranged in the same row are coupled to a source select line extending in a row direction, and source select transistors of cell strings arranged in different rows are coupled to different source select lines. In FIG. 4, source select transistors of cell strings CS11 to CS1m in a first row are coupled to a first source select line SSL1. The source select transistors of cell strings CS21 to CS2m in a second row are coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite a positive (+) Z direction and are coupled in series between the source select transistor SST and the pipe transistor PT. The (p+1)-th to n-th memory cells MCp+1 to MCn are sequentially arranged in the +Z direction and are coupled in series between the pipe transistor PT and the drain select transistor DST. The first to p-th memory cells MC1 to MCp and the (p+1)-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is coupled between the corresponding bit line and the memory cells MCp+1 to MCn. The cell strings in a row direction are coupled to drain select lines extending in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extending in a column direction. In FIG. 4, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form an additional page. Cell strings arranged in the direction of a single row may be selected by selecting one of the drain select lines DSL1 and DSL2. A single page may be selected from the selected cell strings by selecting one of the word lines WL1 to WLn.

In an embodiment, instead of the first to m-th bit lines BL1 to BLm, even bit lines and odd bit lines may be provided. Further, even-numbered cell strings, among the cell strings CS11 to CS1m or CS21 to CS2m arranged in the row direction, may be coupled to respective even bit lines. Odd-numbered cell strings, among the cell strings CS11 to CS1m or CS21 to CS2m arranged in the row direction, may be coupled to respective odd bit lines.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 5:
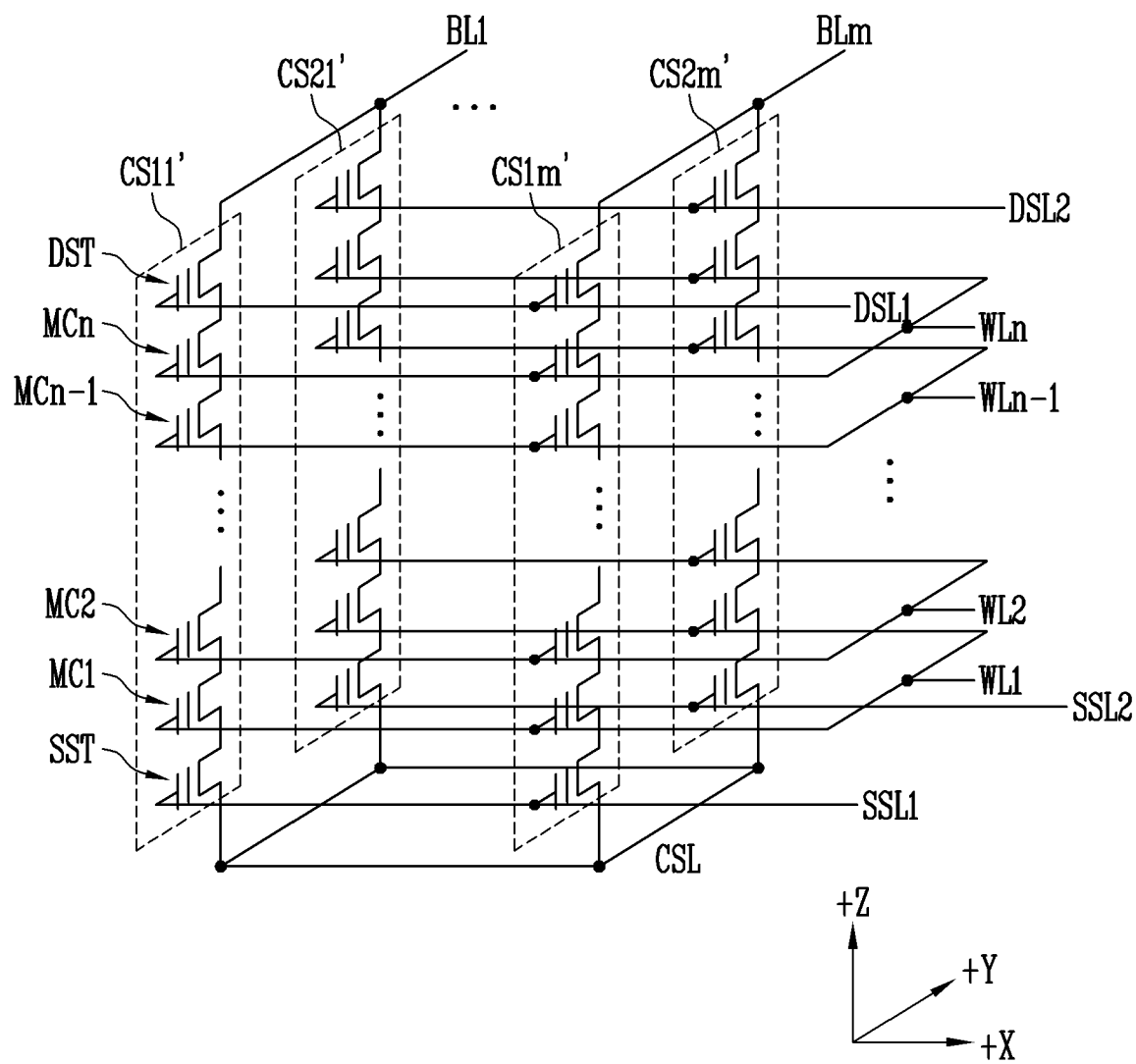
FIG. 5 is a circuit diagram illustrating an example of a memory block BLKb of the memory blocks BLK1 to BLKz of FIG. 3 according to an embodiment of the present disclosure.

FIG. 5 is a circuit diagram illustrating an example of a memory block BLKb of the memory blocks BLK1 to BLKz of FIG. 3 according to an embodiment of the present disclosure.

Referring to FIG. 5, the memory block BLKb may include a plurality of cell strings CS11' to CS1m' and CS21' to CS2m'. Each of the cell strings CS11' to CS1m' and CS21' to CS2m' extends in a positive (+) Z direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

The source select transistor SST of each cell string is coupled between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. The gates of the first to n-th memory cells MC1 to MCn are coupled to first to n-th word lines WL1 to WLn, respectively.

The drain select transistor DST of each cell string is coupled between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 5 has an equivalent circuit similar to that of the memory block BLKa of FIG. 4 except that a pipe transistor PT is excluded from each cell string.

In an embodiment, instead of the first to m-th bit lines BL1 to BLm, even bit lines and odd bit lines may be provided. Further, even-numbered cell strings, among the cell strings CS11' to CS1m' or CS21' to CS2m' arranged in the row direction, may be coupled to respective even bit lines. Odd-numbered cell strings, among the cell strings CS11' to CS1m' or CS21' to CS2m' arranged in the row direction, may be coupled to respective odd bit lines.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As the number of dummy memory cells that are provided increases, the reliability of operation of the memory block BLKb may be improved, whereas the size of the memory block BLKb may increase. As the number of dummy memory cells that are provided decreases, the size of the memory block BLKb may decrease, whereas the reliability of operation of the memory block BLKb may be deteriorated.

In order to efficiently control the one or more dummy memory cells, respective dummy memory cells may have required threshold voltages. Before or after an erase operation on the memory block BLKb is performed, program operations may be performed on all or some of the dummy memory cells. When the erase operation is performed after the program operations are performed, the dummy memory cells may have required threshold voltages by controlling voltages to be applied to dummy word lines coupled to respective dummy memory cells.

Figure 6:
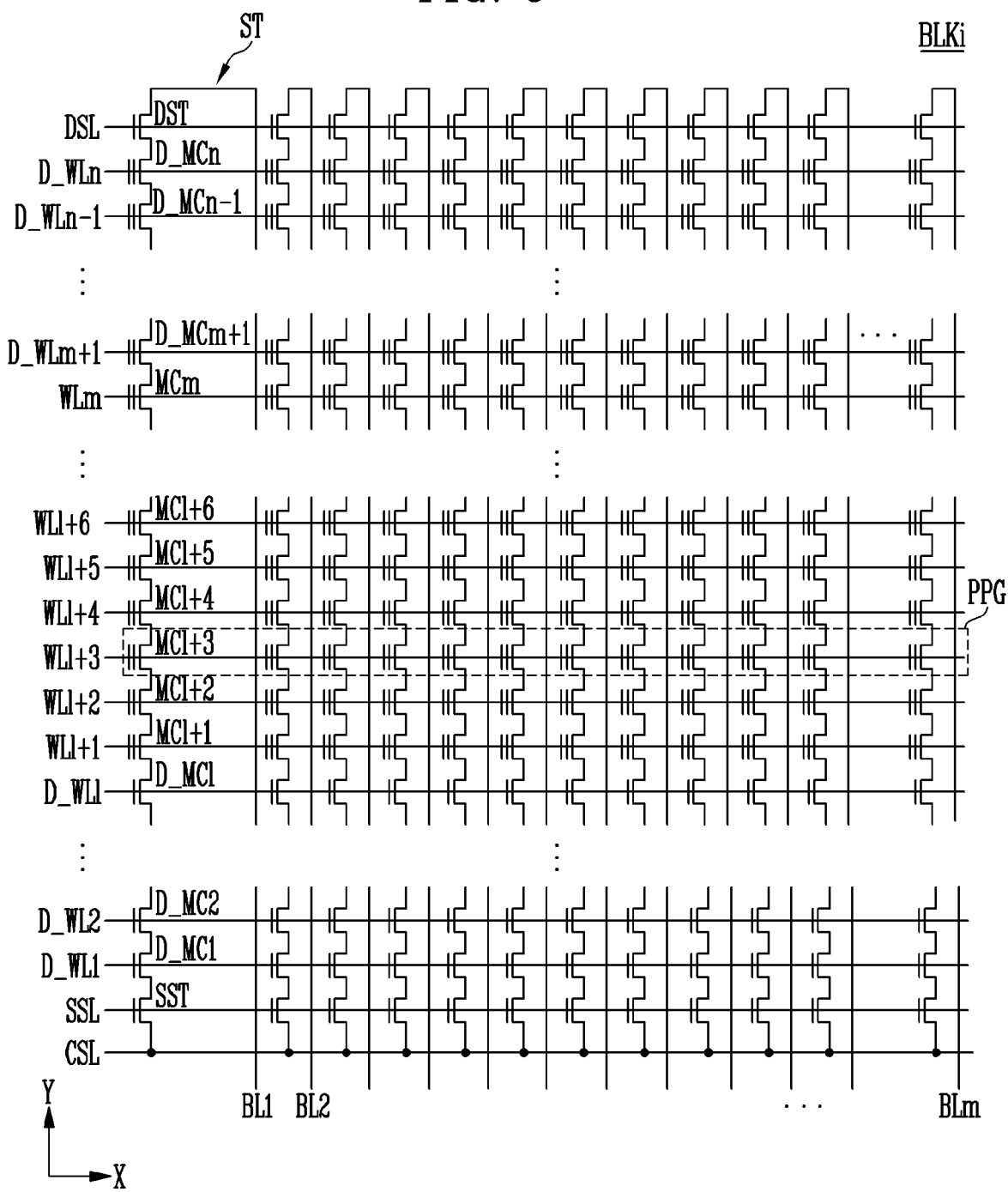
FIG. 6 is a circuit diagram illustrating an example of a memory block BLKi of the memory blocks BLK1 to BLKz of FIG. 3 according to an embodiment of the present disclosure.

FIG. 6 is a circuit diagram illustrating an example of a memory block BLKi of the memory blocks BLK1 to BLKz of FIG. 3 according to an embodiment of the present disclosure.

Referring to FIG. 6, a plurality of word lines may be coupled in parallel between a first select line and a second select line. Here, the first select line may be a source select line SSL, and the second select line may be a drain select line DSL. More specifically, the memory block BLKi may include a plurality of strings ST coupled between bit lines BL1 to BLm and a common source line CSL. The bit lines BL1 to BLm may be coupled to respective strings ST, and the common source line CSL may be coupled in common to the strings ST. The strings ST may be configured in the same manner, and thus the string ST coupled to the first bit line BL1 will be described in detail by way of example.

The string ST may include a source select transistor SST, a plurality of memory cells MCl+1 to MCm and a plurality of dummy memory cells D_MC1 to D_MCl and D_MCm+1 to D_MCn, and a drain select transistor DST, which are coupled in series to each other between the common source line CSL and the first bit line BL1. At least one source select transistor SST and at least one drain select transistor DST may be included in one string ST.

A source of the source select transistor SST may be coupled to the common source line CSL, and a drain of the drain select transistor DST may be coupled to the first bit line BL1. The memory cells MCl+1 to MCm may be coupled in series between the dummy memory cells D_MC1 to D_MCl adjacent to the source select transistor SST and the dummy memory cells D_MCm+1 to D_MCn adjacent to the drain select transistor DST. The dummy memory cells D_MC1 to D_MCl adjacent to the source select transistor SST may be coupled in series between the memory cells MCl+1 to MCm and the source select transistor SST. The dummy memory cells D_MCm+1 to D_MCn adjacent to the drain select transistor DST may be coupled in series between the memory cells MCl+1 to MCm and the drain select transistor DST. Gates of the source select transistors SST included in different strings ST may be coupled to the source select line SSL, gates of the drain select transistors DST included in different strings ST may be coupled to the drain select line DSL, and gates of the memory cells MCl+1 to MCm may be coupled to a plurality of word lines WL1 to WLm, respectively. The plurality of dummy memory cells D_MC1 to D_MCl and D_MCm+1 to D_MCn may be coupled to a plurality of dummy word lines D_WL1 to D_WLl and D_WLm+1 to D_WLn, respectively. A group of memory cells coupled to the same word line, among the memory cells included in different strings ST, may be referred to as a 'physical page (PPG)'. Therefore, the memory block BLKi may include a number of physical pages (PPG) identical to the number of word lines WLl+1 to WLm.

One memory cell may store one bit of data. This cell is typically designated as a "single-level cell (SLC)." In this case, one physical page PPG may store data corresponding to one logical page LPG. The data corresponding to one logical page (LPG) may include a number of data bits identical to the number of cells included in one physical page (PPG).

One memory cell may store two or more bits of data. In this case, one physical page (PPG) may store data corresponding to two or more logical pages (LPG).

Figure 7:
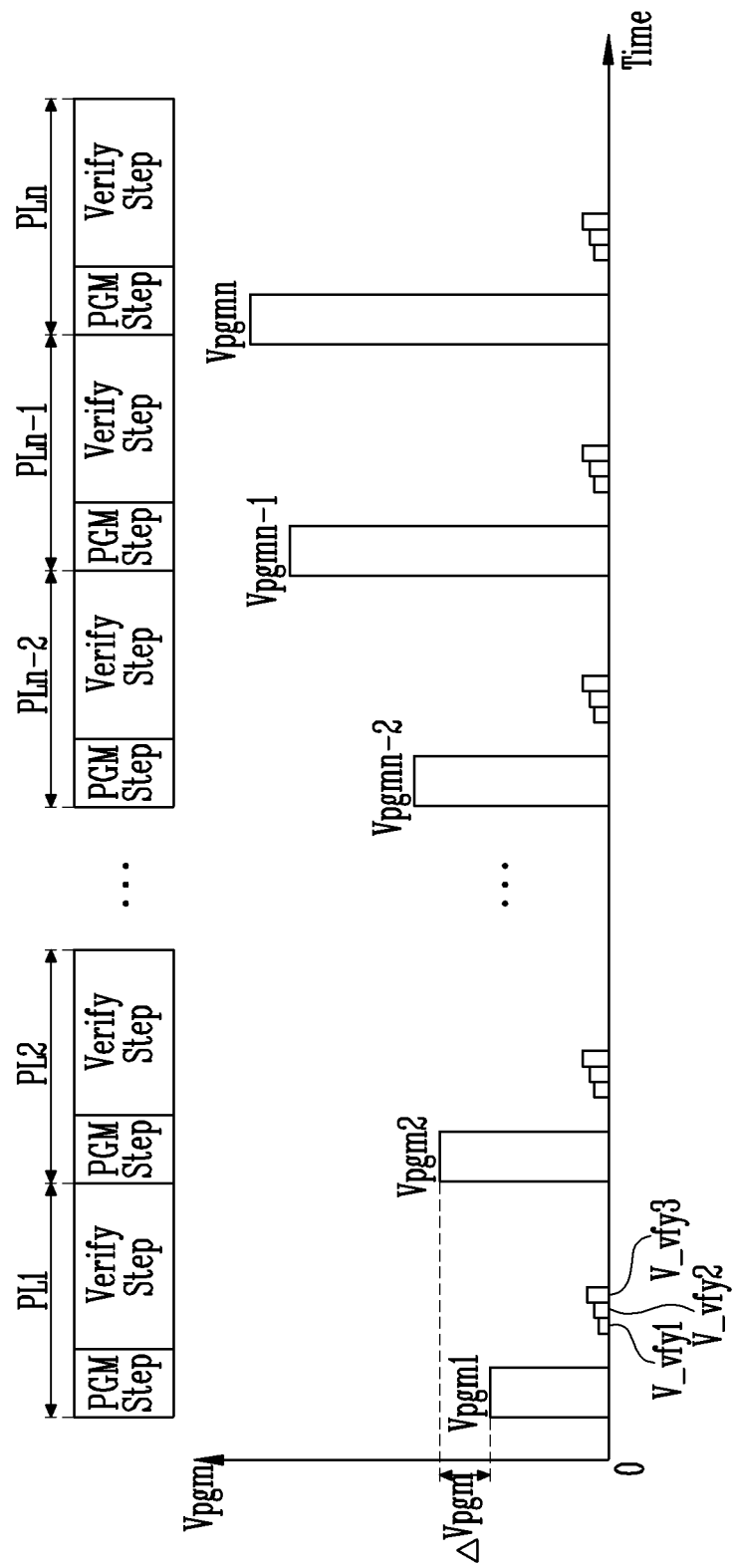
FIG. 7 is a diagram for describing a program operation of a memory device according to an embodiment of the present disclosure.

FIG. 7 is a diagram for describing a program operation of a memory device according to an embodiment of the present disclosure.

In FIG. 7, for convenience of description, each of a plurality of memory cells is a multi-level cell (MLC) which stores two bits of data. However, the scope of the present disclosure is not limited thereto, and each of the plurality of memory cells may be a triple-level cell (TLC) which stores three bits of data or a quad-level cell (QLC) which stores four bits of data.

A program operation may be an operation of increasing the threshold voltage of each memory cell depending on the data to be stored in the corresponding memory cell. When the program operation is performed, each of the memory cells may have a threshold voltage corresponding to one of a plurality of program states. After the program operation has been performed, the threshold voltages of the memory cells may be determined depending on the data to be stored in the memory cells. Each of the memory cells may have one of the plurality of program states as a target program state. The target program state may be determined depending on the data to be stored in the corresponding memory cell.

The program operation of the memory device 100 may include a plurality of program loops PL1 to PLn. The memory device 100 may perform a program operation so that each of selected memory cells has a threshold voltage corresponding to one of a plurality of program states by performing the plurality of program loops PL1 to PLn. Each of the plurality of program loops PL1 to PLn may include a program voltage application operation (PGM Step) and a verify operation (Verify Step).

The program voltage application operation (PGM Step) may be the operation of applying a program voltage to a selected word line coupled to the selected memory cells. For example, the memory device 100 may apply a first program voltage Vpgm1 to the selected word line coupled to selected memory cells in the first program loop PL1. At the program voltage application operation (PGM Step), each of the selected memory cells may be programmed to the target program state, among the plurality of program states.

The verify operation may be the operation of applying a verify voltage to the selected word line coupled to the selected memory cells. The verify operation may be the operation of verifying the program states of the selected memory cells. In detail, the verify operation may be the operation of determining whether the selected memory cells have been programmed to target program states, among the plurality of program states. The verify operation may be the operation of applying verify voltages corresponding to the target program states of the selected memory cells. For example, when the selected memory cells are read as off-cells using verify voltages corresponding to respective target program states of the selected memory cells, the selected memory cells may pass the verify operation.

In an embodiment, in the first program loop PL1, after the first program voltage Vpgm1 is applied to the selected word line coupled to the selected memory cells, the memory device 100 may sequentially apply first to third verify voltages V_vfy1 to V_vfy3 to the selected word line. In this case, the verify operation may be performed by applying the first verify voltage V_vfy1 to memory cells having a first program state as the target program state. The verify operation may be performed by applying the second verify voltage V_vfy2 to memory cells having a second program state as the target program state. The verify operation may be performed by applying the third verify voltage V_vfy3 to memory cells having a third program state as the target program state.

It may be determined that the memory cells having passed the verify operation using respective verify voltages V_vfy1 to V_vfy3 have the target program states. The memory cells having passed the verify operation may be program-inhibited in the second program loop PL2. A program-inhibit voltage may be applied to bit lines coupled to the program-inhibited memory cells.

It may be determined that the memory cells having failed the verify operation using respective verify voltages V_vfy1 to V_vfy3 do not have target program states. The memory cells having failed the verify operation may perform the second program loop PL2.

In the second program loop PL2, the memory device 100 may apply a second program voltage Vpgm2, higher than the first program voltage Vpgm1 by a unit voltage ΔVpgm, to a selected word line coupled to selected memory cells. Thereafter, the memory device 100 may perform the verify operation of the second program loop PL2 in the same manner as the verify operation of the first program loop PL1.

Thereafter, the memory device 100 may perform a subsequent program loop in the same manner as the second program loop PL2 a preset number of times.

In an embodiment, when the program operation is not completed within a preset number of program loops, the program operation may fail. When the program operation is completed within a preset number of program loops, the program operation may pass. Whether the program operation is completed may be determined depending on whether all of the selected memory cells have passed the verify operation. When all of the selected memory cells have passed the verify operation, a subsequent program loop may not be performed.

In an embodiment, the program voltage may be determined based on an incremental step pulse programming (ISPP) method. The level of the program voltage may be increased or decreased by stages (i.e., by a step voltage) as the program loops PL1 to PLn are repeated. The number of applications of program voltages used in each program loop, the voltage levels of the program voltages, voltage application times, etc. may be determined in various forms under the control of the memory controller 200.

Figure 8A:
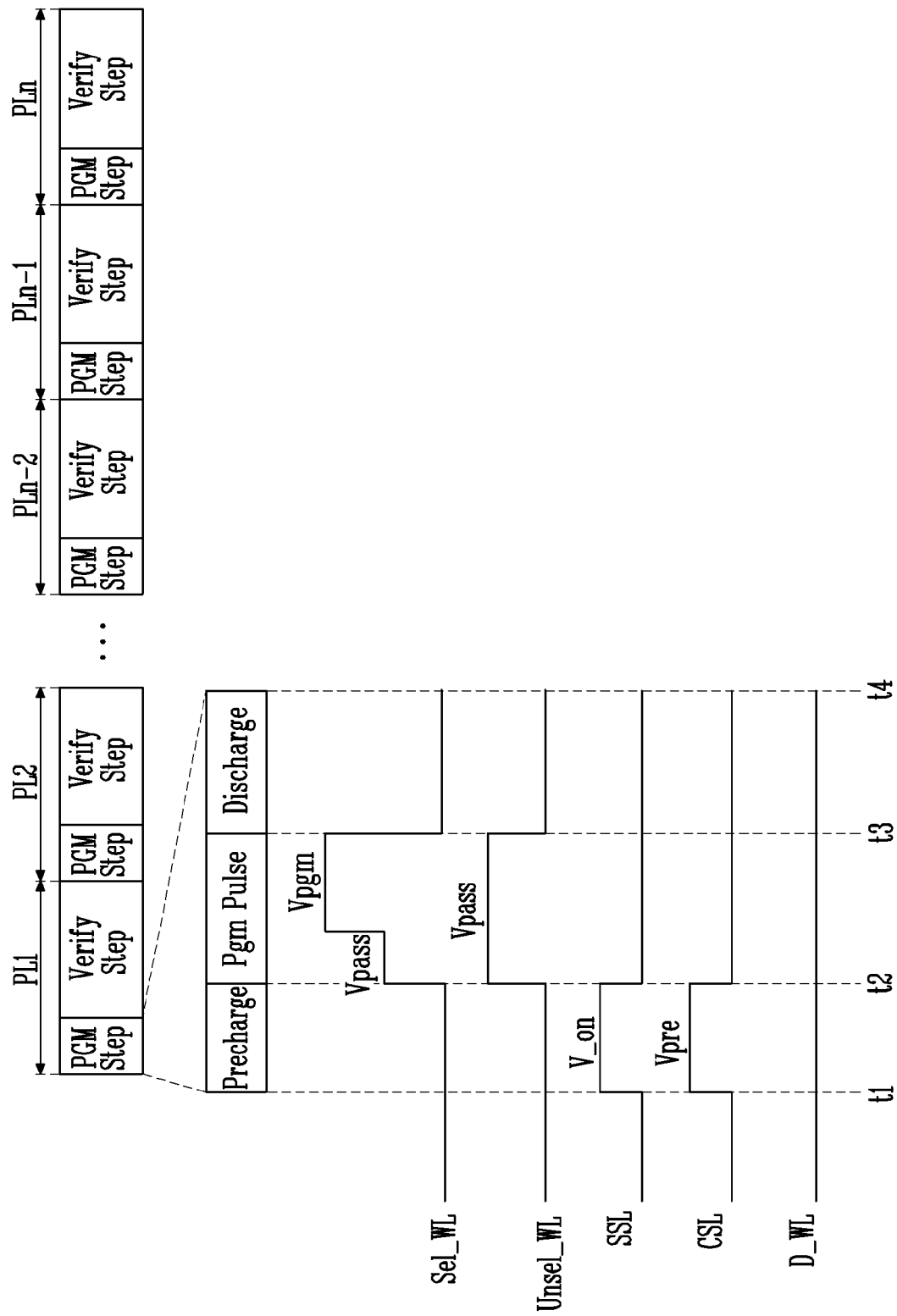
FIG. 8A is a diagram for describing a program voltage application operation in a program operation of a memory device according to an embodiment of the present disclosure.

FIG. 8A is a diagram for describing a program voltage application operation in a program operation of a memory device according to an embodiment of the present disclosure.

Referring to FIG. 8A, the program operation of the memory device 100 may include a plurality of program loops PL1 to PLn. Each of the plurality of program loops PL1 to PLn may include a program voltage application operation (PGM Step) and a verify operation (Verify Step).

The program voltage application operation (PGM Step) included in each of the plurality of program loops PL1 to PLn may include a precharge period, a program pulse (Pgm Pulse) period, and a discharge period.

A period from t1 to t2 may be the precharge period. The precharge period may be a period during which a common source line CSL is precharged. For example, the memory device 100 may apply a precharge voltage Vpre to the common source line CSL and apply a turn-on voltage V_on to a source select line SSL during the precharge period. Here, the turn-on voltage V_on may be a voltage higher than the threshold voltage of a source select transistor coupled to the source select line SSL.

A period from t2 to t3 may be the program pulse (Pgm Pulse) period. The program voltages Vpgm1 to Vpgmn illustrated in FIG. 7 may be applied to a selected word line Sel_WL coupled to selected memory cells during the program pulse (Pgm Pulse) period.

The program pulse (Pgm Pulse) period may be a period during which data is stored in the selected memory cells. For example, during the program pulse (Pgm Pulse) period, the memory device 100 may apply a pass voltage Vpass to the selected word line Sel_WL coupled to the selected memory cells for a certain period of time and then apply a program voltage Vpgm to the selected word line Sel_WL, and may apply the pass voltage Vpass to an unselected word line Unsel_WL. During the program pulse (Pgm Pulse) period, the memory device 100 may apply a ground voltage GND to the source select line SSL and the common source line CSL.

A period from t3 to t4 may be the discharge period. During the discharge period, the memory device 100 may apply the ground voltage GND to the selected word line Sel_WL and the unselected word line Unsel_WL.

Figure 8B:
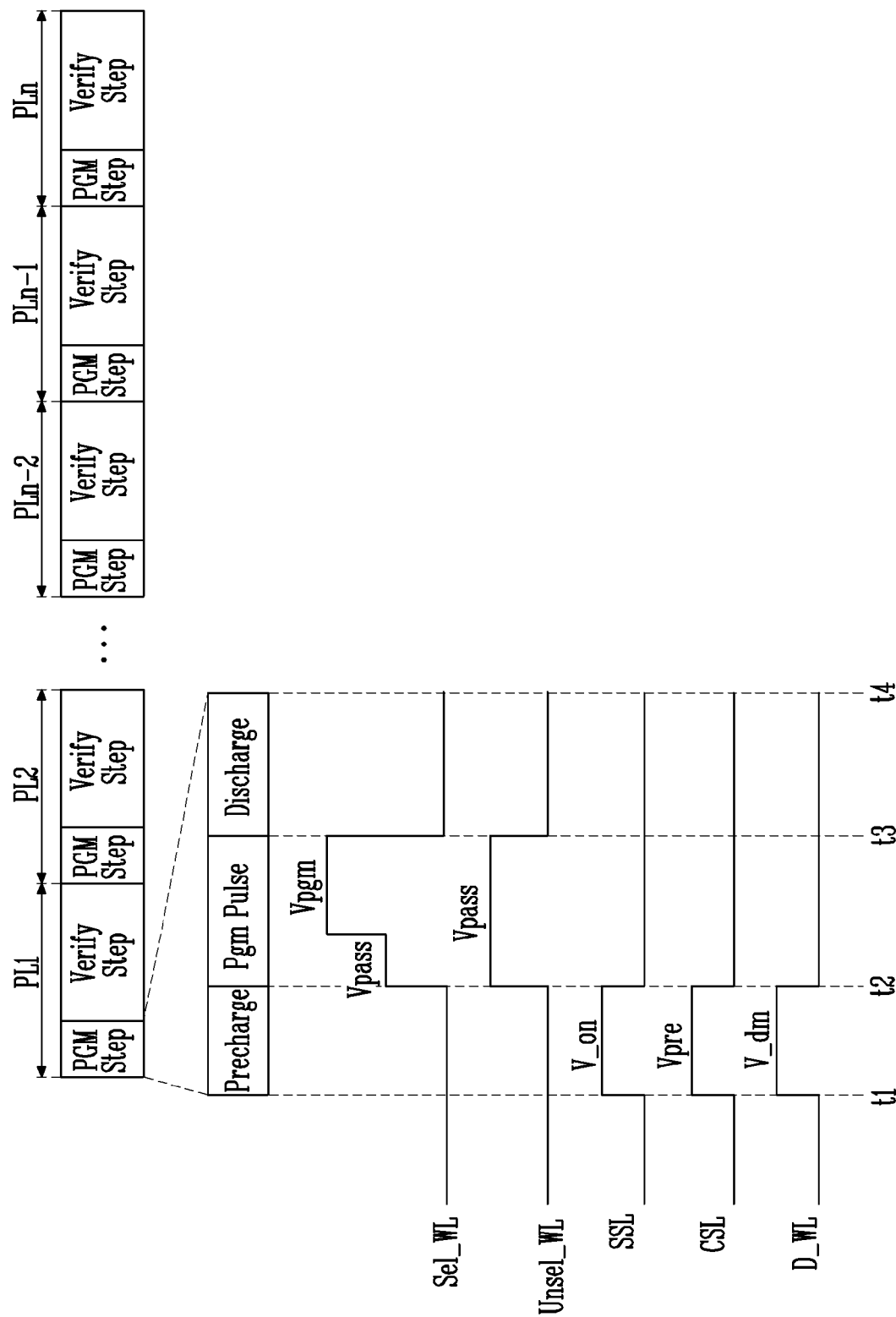
FIG. 8B is a diagram for describing an example of a program voltage application operation in a program operation of a memory device according to an embodiment of the present disclosure.

FIG. 8B is a diagram for describing an example of a program voltage application operation in a program operation of a memory device according to an embodiment of the present disclosure.

In an embodiment, FIG. 8B is a diagram for describing an example in which an operation of applying a dummy voltage V_dm to dummy word lines D_WL is added to a precharge period of the program voltage application operation, described above with reference to FIG. 8A. Therefore, in FIG. 8B, descriptions of components the same as those in FIG. 8A will be omitted.

Referring to FIG. 8B, a period from t1 to t2 may be a precharge period. For example, during the precharge period, the memory device 100 may apply a precharge voltage Vpre to a common source line CSL and apply a turn-on voltage V_on to a source select line SSL. Furthermore, during the precharge period, the memory device 100 may apply a dummy voltage V_dm to dummy word lines D_WL coupled to dummy memory cells.

Figure 9:
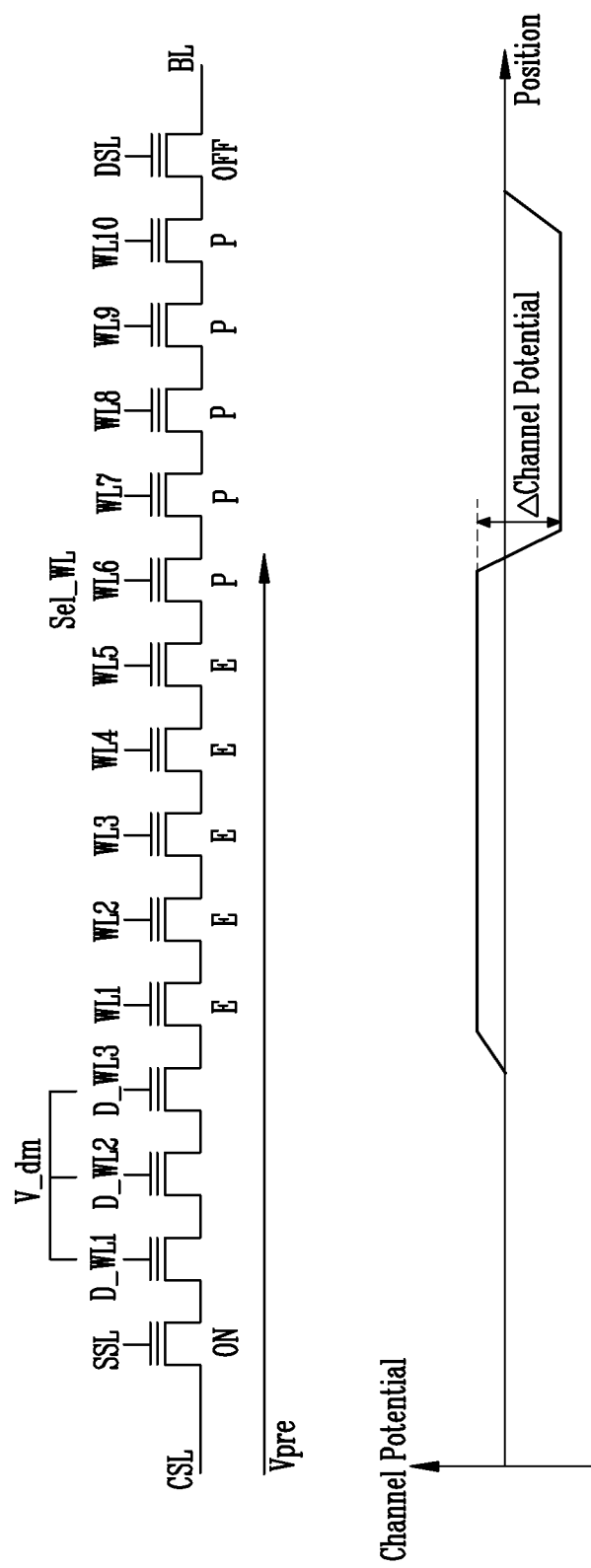
FIG. 9 is a diagram for describing a channel potential changed at a program voltage application operation in a program operation of a memory device according to an embodiment of the present disclosure.

FIG. 9 is a diagram for describing a channel potential changed at a program voltage application operation in a program operation of a memory device according to an embodiment of the present disclosure.

In FIG. 9, a horizontal axis indicates the positions of transistors coupled between a common source line CSL and a bit line BL, and a vertical axis indicates a channel potential.

In FIG. 9, for convenience of description, ten word lines WL1 to WL10 and three dummy word lines D_WL1 to D_WL3 are coupled to a memory cell string.

First, in FIG. 9, a channel potential formed by performing one of a plurality of program loops during the program operation of the memory device 100 will be described.

The memory device 100 may verify the program states of selected memory cells using a verify voltage at the verify operation included in any one of the plurality of program loops. Thereafter, the memory device 100 may apply a ground voltage to a plurality of word lines at the verify operation included in the one program loop. Here, the voltages of the plurality of word lines may be discharged to the ground voltage. However, the voltages of word lines coupled to memory cells in a program state, among the plurality of word lines, may be first discharged to the ground voltage. That is, the channel potential corresponding to the memory cells in a program state may be cut off first.

Thereafter, charges in a cut-off channel region may suffer negative down-coupling, and thus all of the channel potentials coupled to the memory cell string may be decreased to a negative state. Further, because the channel potentials corresponding to the memory cells in a program state are cut off first, they may be lower than channel potentials corresponding to memory cells in an erased state. Therefore, when a loop subsequent to one program loop is performed after the verify operation included in the one program loop has been terminated, a channel potential coupled to the memory cell string may be in a negative state.

Referring to FIG. 9, the memory cell string may include a plurality of memory cells coupled in series to each other between the bit line BL and the common source line CSL. The plurality of memory cells may be coupled to the plurality of word lines WL1 to WL10, respectively. A drain select line DSL may be coupled between the plurality of memory cells and the bit line BL, and a source select line SSL may be coupled between the plurality of memory cells and the common source line CSL. A plurality of dummy memory cells may be coupled between the plurality of memory cells and the source select line SSL. The plurality of dummy memory cells may be coupled to a plurality of dummy word lines D_WL1 to D_WL3, respectively.

In an embodiment, a program operation may be performed in a direction from the tenth word line WL10 adjacent to the drain select line DSL to the first word line WL1 adjacent to the dummy word lines D_WL1 to D_WL3.

For example, when a program operation is performed on the sixth word line WL6, a channel potential coupled to the memory cell string may be in a negative state after a verify operation included in one of the plurality of program loops is terminated. Thereafter, the memory device 100 may apply a precharge voltage Vpre to the common source line CSL and apply a turn-on voltage V_on to the source select line SSL during a precharge period included in a program loop subsequent to the one program loop.

Here, the channel potentials of the first to sixth word lines WL1 to WL6 may rise due to the precharge voltage Vpre applied during the precharge period. For example, the channel potentials of the first to sixth word lines WL1 to WL6 may rise from a negative state to a positive state. However, the channel potentials of the seventh to tenth word lines WL7 to WL10 may still remain in a negative state, without being influenced by the precharge voltage Vpre. Therefore, a channel potential difference (ΔChannel Potential) may occur between the channel potentials of the first to sixth word lines WL1 to WL6 and the channel potentials of the seventh to tenth word lines WL7 to WL10. In this case, charges present in the channel region of memory cells coupled to the sixth word line WL6 may have higher energy due to the channel potential difference (ΔChannel Potential). Thereafter, charges having high energy may be injected into the gates of the memory cells coupled to the sixth word line WL6. This is called a hot carrier injection (HCI) phenomenon. As a result, in the memory cells coupled to the sixth word line WL6, a disturbance phenomenon in which the threshold voltages of the memory cells rise due to the hot carrier injection (HCI) phenomenon may occur. In particular, when the memory cells are in an erased state, such a phenomenon may be aggravated. Furthermore, as the magnitude of the precharge voltage Vpre, applied to the common source line CSL during the precharge period, is greater, the channel potential difference (ΔChannel Potential) is increased, and a degree to which the threshold voltages of memory cells coupled to the sixth word line WL6 rise may be increased due to the disturbance phenomenon.

However, when the magnitude of the precharge voltage Vpre, applied to the common source line CSL during the precharge period, is small, the channel potentials of the first to sixth word lines WL1 to WL6 may still remain in a negative state. For example, if the channel potential of the sixth word line WL6 is in a negative state when a program voltage is applied to the sixth word line WL6, Fowler Nordheim (FN) stress is applied to memory cells coupled to the sixth word line WL6 due to the difference between the magnitude of the program voltage and the channel potential of the sixth word line WL6, and the threshold voltages of the memory cells coupled to the sixth word line WL6 may rise. That is, a disturbance phenomenon caused by the FN stress may occur. The greater the difference between the magnitude of the program voltage applied to the sixth word line WL6 and the channel potential of the sixth word line WL6, the more severe the disturbance phenomenon caused by the FN stress. That is, the lower the channel potential of the sixth word line WL6, the more severe the disturbance phenomenon caused by the FN stress.

Also, the thickness (i.e., dimension) of the word lines may vary depending on the positions of the word lines. For example, although the case where the selected word line Sel_WL is the sixth word line WL6 is illustrated in FIG. 9, a disturbance phenomenon caused by hot carrier injection may be decreased as the selected word line Sel_WL on which the program operation is performed is changed in a direction from the fifth word line WL5 to the first word line WL1, unlike the above case. That is, the closer the selected word line Sel_WL is to the source select line SSL, the less severe the disturbance phenomenon caused by hot carrier injection.

Therefore, an embodiment of the present disclosure may decrease a disturbance phenomenon occurring due to hot carrier injection or FN stress by changing the magnitude of the precharge voltage Vpre to be applied to the common source line CSL depending on the magnitude of the program voltage applied to each of a plurality of program loops during a precharge period. Further, in an embodiment of the present disclosure, the memory device 100 may decrease a disturbance phenomenon occurring due to hot carrier injection or FN stress by changing at least one of the times during which the precharge voltage is applied, the magnitude of the dummy voltage to be applied to a plurality of dummy word lines, and the time during which the dummy voltage is applied, depending on the magnitude of the program voltage applied to each of a plurality of program loops during a precharge period.

Furthermore, the memory device 100 may decrease a disturbance phenomenon occurring due to hot carrier injection or FN stress by changing at least one of the magnitude of the precharge voltage Vpre to be applied to the common source line CSL, the time during which the precharge voltage is applied, the magnitude of the dummy voltage V_dm to be applied to the plurality of dummy word lines, and the time during which the dummy voltage is applied, as the selected word line Sel_WL coupled to selected memory cells is closer to the source select line SSL.

Figure 10A:
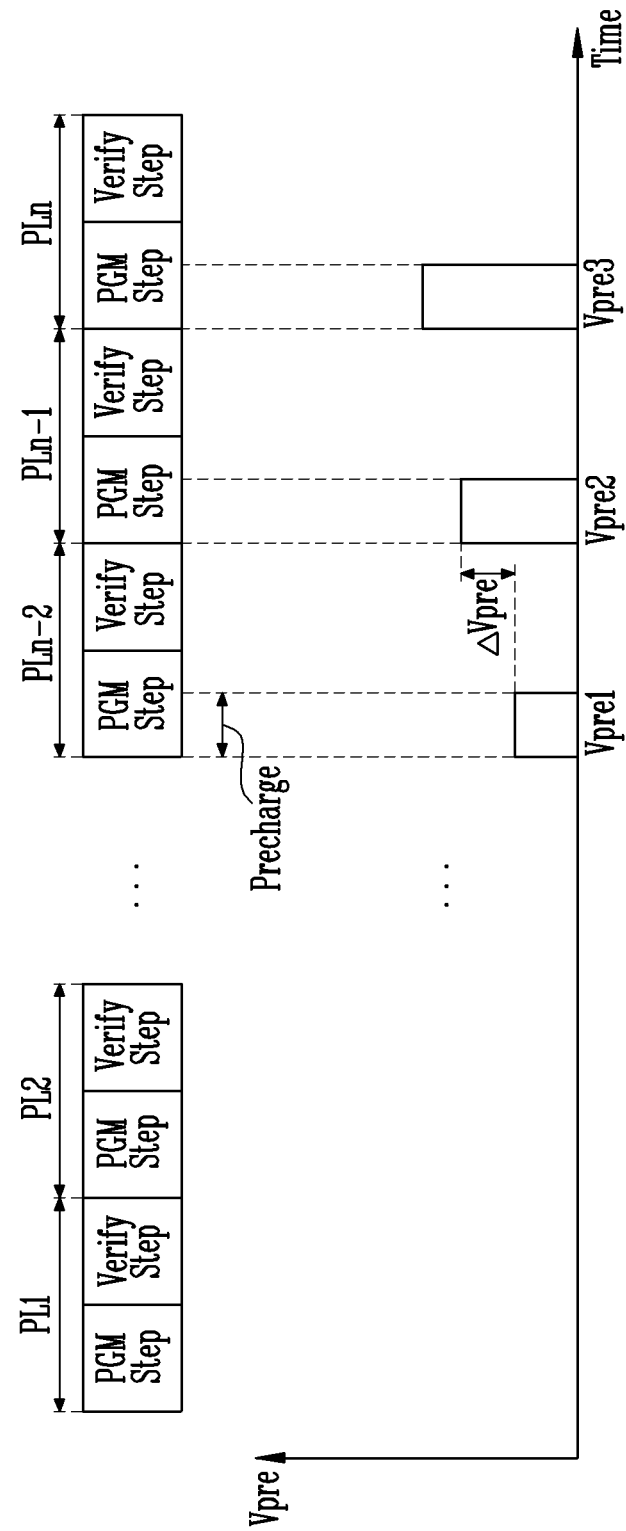
FIG. 10A is a diagram for describing an operation of changing the magnitude of a precharge voltage depending on the magnitude of a program voltage in a program operation of a memory device according to an embodiment of the present disclosure.

FIG. 10A is a diagram for describing an operation of changing the magnitude of a precharge voltage depending on the magnitude of a program voltage in a program operation of a memory device according to an embodiment of the present disclosure.

In FIG. 10A, the horizontal axis of the graph indicates time and the vertical axis thereof indicates the magnitude of a precharge voltage Vpre applied to a common source line.

Referring to FIG. 10A, the program operation of the memory device 100 may include a plurality of program loops PL1 to PLn. Each of the plurality of program loops PL1 to PLn may include a program voltage application operation (PGM Step) and a verify operation (Verify Step).

The program voltage application operation (PGM Step) included in each of the plurality of program loops PL1 to PLn may include a precharge period, a program pulse (Pgm Pulse) period, and a discharge period.

The memory device 100 may apply the precharge voltage Vpre to the common source line during the precharge period of each of the plurality of program loops PL1 to PLn. In an embodiment, the memory device 100 may change the magnitude of the precharge voltage Vpre to be applied to the common source line depending on the magnitude of the program voltage applied in each of the plurality of program loops PL1 to PLn. In detail, the memory device 100 may change the magnitude of the precharge voltage Vpre to be applied to the common source line depending on the magnitude of the program voltage Vpgm applied in the program pulse (Pgm Pulse) period. The magnitude of the program voltage Vpgm may be increased as the plurality of program loops PL1 to PLn are performed.

In an embodiment, the memory device 100 may apply the precharge voltage Vpre to the common source line in an order from a preset program loop, among the plurality of program loops PL1 to PLn.

For example, when the preset program loop is an n-2-th program loop PLn−2, the memory device 100 may apply a first precharge voltage Vpre1 to the common source line during the precharge period of the n-2-th program loop PLn-2. However, unlike the example illustrated in FIG. 10A, when the preset program loop is the first program loop PL1, the memory device 100 may apply the first precharge voltage Vpre1 to the common source line during the precharge period of the first program loop PL1. The memory device 100 may apply a second precharge voltage Vpre2, higher than the first precharge voltage Vpre1, to the common source line during the precharge period of an n-1-th program loop PLn-1. The memory device 100 may apply a third precharge voltage Vpre3, higher than the second precharge voltage Vpre2, to the common source line during the precharge period of the n-th program loop PLn.

In an example, the increment ΔVpre in the magnitude of the precharge voltage Vpre may be set to any of various values in accordance with an embodiment.

For example, the magnitude of the precharge voltage applied in the precharge period of the current program loop may be increased from the magnitude of the precharge voltage applied in the precharge period of a previous program loop by a preset value. In this case, the increment in the magnitude of the precharge voltage Vpre may be constant.

In other examples, the magnitude of the precharge voltage applied in the precharge period of the current program loop may be increased from the magnitude of the precharge voltage applied in the precharge period of the previous program loop by a preset ratio. In this case, the increment in the magnitude of the precharge voltage Vpre may be increased according to the preset ratio.

Figure 10B:
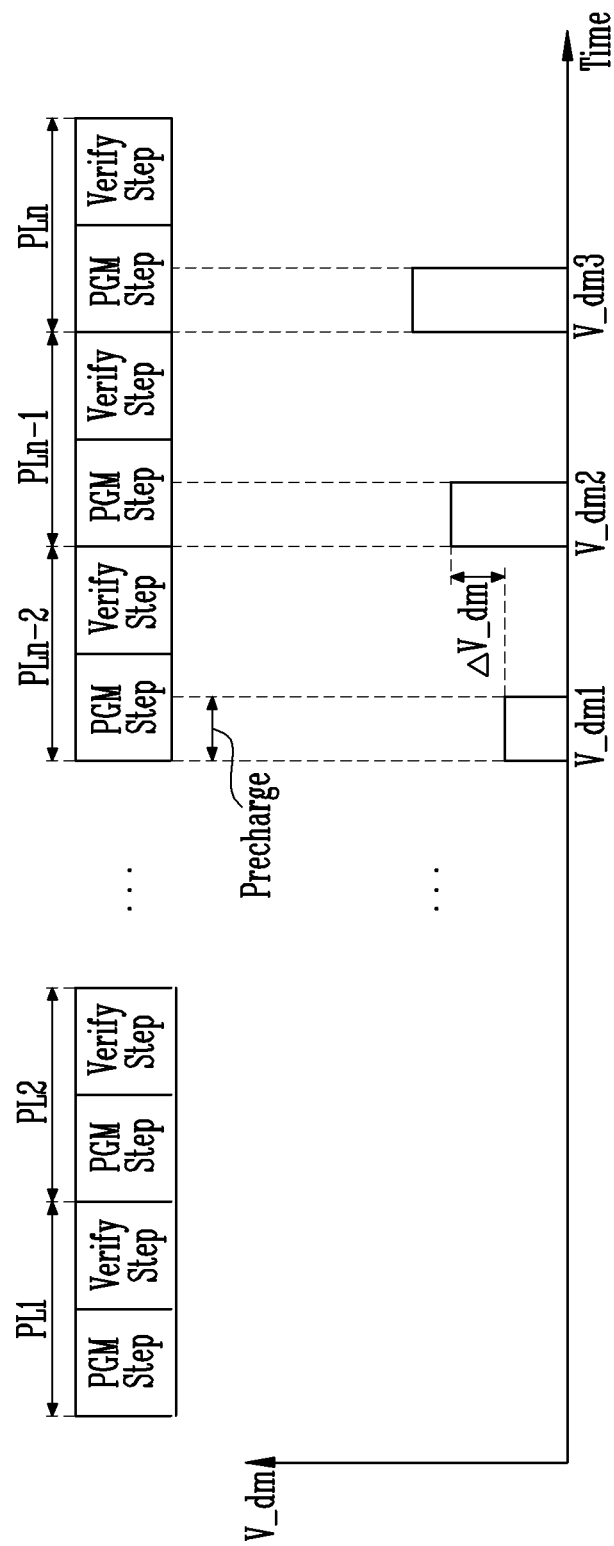
FIG. 10B is a diagram for describing an operation of changing the magnitude of a dummy voltage depending on the magnitude of a program voltage in a program operation of a memory device according to an embodiment of the present disclosure.

FIG. 10B is a diagram for describing an operation of changing the magnitude of a dummy voltage depending on the magnitude of a program voltage in a program operation of a memory device according to an embodiment of the present disclosure.

In FIG. 10B, the horizontal axis of the graph indicates time and the vertical axis thereof indicates the magnitude of a dummy voltage V_dm applied to a dummy word line.

In FIG. 10B, descriptions of components the same as those in FIG. 10A will be omitted.

Referring to FIG. 10B, the memory device 100 may apply a dummy voltage V_dm to a plurality of dummy word lines during the precharge period of each of a plurality of program loops PL1 to PLn. In an embodiment, the memory device 100 may change the magnitude of the dummy voltage V_dm to be applied to a plurality of dummy word lines depending on the magnitude of the program voltage applied in each of the plurality of program loops PL1 to PLn.

In an embodiment, the memory device 100 may apply the dummy voltage V_dm to the plurality of dummy word lines in an order from a preset program loop.

For example, when the preset program loop is an n-2-th program loop PLn-2, the memory device 100 may apply a first dummy voltage V_dm1 to the plurality of dummy word lines during the precharge period of the n-2-th program loop PLn-2. However, unlike the example illustrated in FIG. 10B, when the preset program loop is the first program loop PL1, the memory device 100 may apply the first dummy voltage V_dm1 to the plurality of dummy word lines during the precharge period of the first program loop PL1. The memory device 100 may apply a second dummy voltage V_dm2, higher than the first dummy voltage V_dm1, to the plurality of dummy word lines during the precharge period of an n-1-th program loop PLn-1. The memory device 100 may apply a third dummy voltage V_dm3, higher than the second dummy voltage V_dm2, to the plurality of dummy word lines during the precharge period of the n-th program loop PLn.

In an example, the increment ΔV_dm in the magnitude of the dummy voltage V_dm may be set to any of various values in accordance with an embodiment.

For example, the magnitude of the dummy voltage applied in the precharge period of the current program loop may be increased from the magnitude of the dummy voltage applied in the precharge period of a previous program loop by a preset value. In this case, the increment in the magnitude of the dummy voltage V_dm may be constant.

In other examples, the magnitude of the dummy voltage applied in the precharge period of the current program loop may be increased from the magnitude of the dummy voltage applied in the precharge period of the previous program loop by a preset ratio. In this case, the increment in the magnitude of the dummy voltage V_dm may be increased according to the preset ratio.

In an embodiment, the memory device 100 may apply the dummy voltage V_dm to one or more of the plurality of dummy word lines during the precharge period of each of the plurality of program loops PL1 to PLn. For example, the memory device 100 may apply the dummy voltage V_dm to the dummy word line closest to a plurality of memory cells, among the plurality of dummy word lines, during the precharge period of each of the plurality of program loops PL1 to PLn. The number of dummy word lines to which the dummy voltage V_dm is to be applied may be adjusted to any of various values.

Figure 11A:
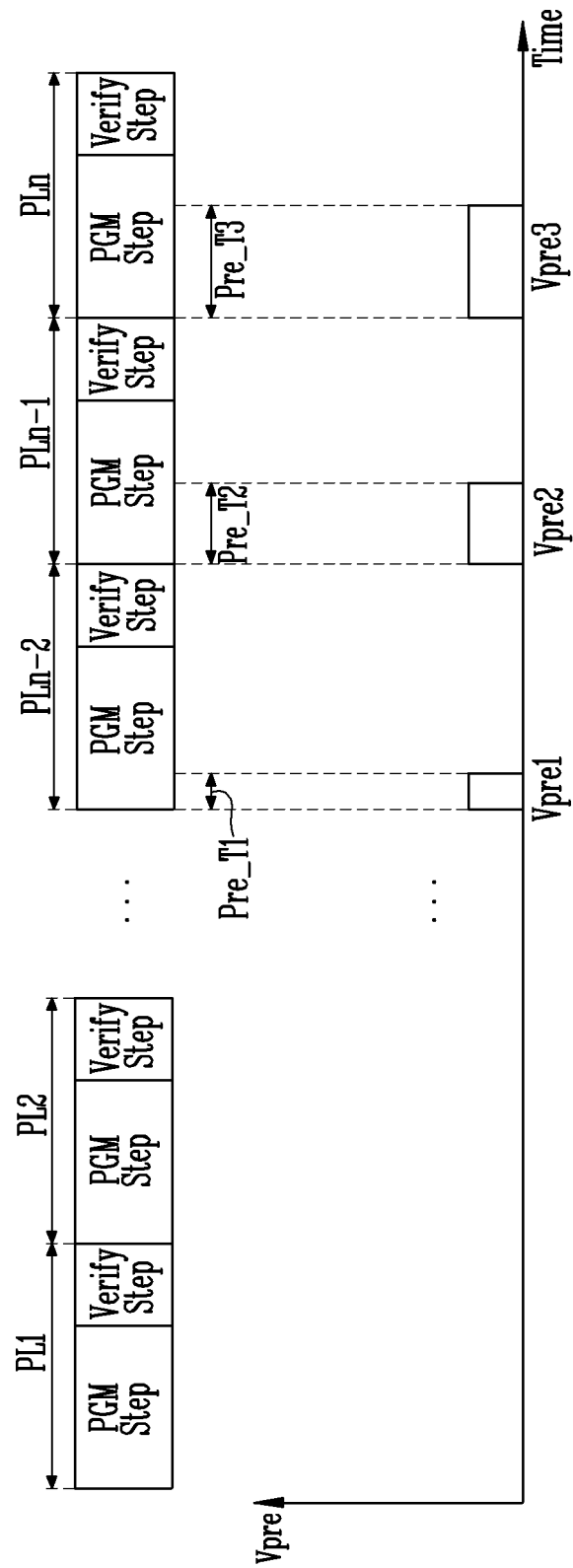
FIG. 11A is a diagram for describing an operation of changing the time during which a precharge voltage is applied depending on the magnitude of a program voltage in a program operation of a memory device according to an embodiment of the present disclosure.

FIG. 11A is a diagram for describing an operation of changing the time during which a precharge voltage is applied depending on the magnitude of a program voltage in a program operation of a memory device according to an embodiment of the present disclosure.

In FIG. 11A, the horizontal axis of the graph indicates time and the vertical axis thereof indicates the magnitude of a precharge voltage Vpre applied to a common source line.

Referring to FIG. 11A, the program operation of the memory device 100 may include a plurality of program loops PL1 to PLn. Each of the plurality of program loops PL1 to PLn may include a program voltage application operation (PGM Step) and a verify operation (Verify Step).

The program voltage application operation (PGM Step) included in each of the plurality of program loops PL1 to PLn may include a precharge period, a program pulse (Pgm Pulse) period, and a discharge period.

The memory device 100 may apply a precharge voltage Vpre to a common source line for a precharge time Pre_T in the precharge period of each of the plurality of program loops PL1 to PLn. In an embodiment, the memory device 100 may change the time Pre_T during which the precharge voltage is applied to the common source line depending on the magnitude of the program voltage applied in each of the plurality of program loops PL1 to PLn. In detail, the memory device 100 may change the time Pre_T during which the precharge voltage is applied to the common source line depending on the magnitude of the program voltage Vpgm applied in the program pulse (Pgm Pulse) period. The magnitude of the program voltage Vpgm may be increased as the plurality of program loops PL1 to PLn are performed.

In an embodiment, the memory device 100 may apply a first precharge voltage Vpre1 to the common source line for a first precharge time Pre_T1 in the precharge period of an n-2-th program loop PLn-2. However, unlike the example illustrated in FIG. 11A, the memory device 100 may apply the first precharge voltage Vpre1 to the common source line for the first precharge time Pre_T1 in the precharge period of the first program loop PL1. The memory device 100 may apply a second precharge voltage Vpre2 to the common source line for a second precharge time Pre_T2, longer than the first precharge time Pre_T1, in the precharge period of an n−1-th program loop PLn−1. The memory device 100 may apply a third precharge voltage Vpre3 to the common source line for a third precharge time Pre_T3, longer than the second precharge time Pre_T2, in the precharge period of the n-th program loop PLn.

In an example, the increment in the time Pre_T during which the precharge voltage is applied may be set to any of various values in accordance with an embodiment.

For example, the time during which the precharge voltage is applied in the precharge period of the current program loop may be increased from the time during which the precharge voltage is applied in the precharge period of the previous program loop by a preset value. In this case, the increment in the time Pre_T during which the precharge voltage is applied may be constant.

In other examples, the time during which the precharge voltage is applied in the precharge period of the current program loop may be increased from the time during which the precharge voltage is applied in the precharge period of the previous program loop by a preset ratio. In this case, the increment in the time Pre_T during which the precharge voltage is applied may be increased according to the preset ratio.

In an embodiment, the magnitudes of the first to third precharge voltages Vpre1 to Vpre3 may be equal to each other. In other embodiments, the magnitudes of the first to third precharge voltages Vpre1 to Vpre3 may be increased depending on the magnitude of the program voltage.

Figure 11B:
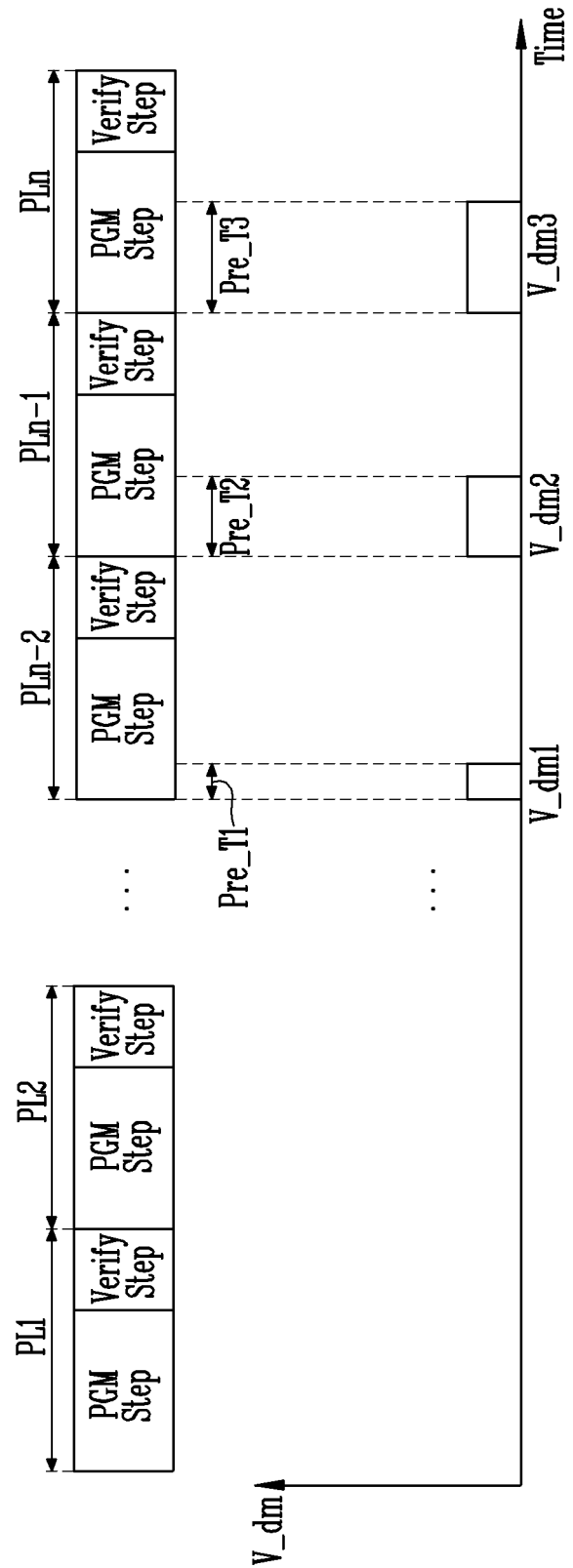
FIG. 11B is a diagram for describing an operation of changing the time during which a dummy voltage is applied depending on the magnitude of a program voltage in a program operation of a memory device according to an embodiment of the present disclosure.

FIG. 11B is a diagram for describing an operation of changing the time during which a dummy voltage is applied depending on the magnitude of a program voltage in a program operation of a memory device according to an embodiment of the present disclosure.

In FIG. 11B, the horizontal axis of the graph indicates time and the vertical axis thereof indicates the magnitude of a dummy voltage V_dm applied to a dummy word line.

In FIG. 11B, descriptions of components the same as those in FIG. 11A will be omitted.

Referring to FIG. 11B, the memory device 100 may apply a dummy voltage V_dm to a plurality of dummy word lines for a precharge time Pre_T in the precharge period of each of a plurality of program loops PL1 to PLn. In an embodiment, the memory device 100 may change the time Pre_T during which the dummy voltage V_dm is applied to the plurality of dummy word lines depending on the magnitude of the program voltage applied in each of the plurality of program loops PL1 to PLn.

In an embodiment, the memory device 100 may apply a first dummy voltage V_dm1 to the plurality of dummy word lines for a first precharge time Pre_T1 in the precharge period of an n−2-th program loop PLn−2. However, unlike the example illustrated in FIG. 11B, the memory device 100 may apply the first dummy voltage V_dm1 to the plurality of dummy word lines for the first precharge time Pre_T1 in the precharge period of the first program loop PL1. The memory device 100 may apply a second dummy voltage V_dm2 to the plurality of dummy word lines for a second precharge time Pre_T2, longer than the first precharge time Pre_T1, in the precharge period of an n−1-th program loop PLn−1. The memory device 100 may apply a third dummy voltage V_dm3 to the plurality of dummy word lines for a third precharge time Pre_T3, longer than the second precharge time Pre_T2, in the precharge period of the n-th program loop PLn.

In an embodiment, the increment in the time Pre_T during which the dummy voltage is applied may be set to any of various values in accordance with an example.

For example, the time during which the dummy voltage is applied in the precharge period of the current program loop may be increased from the time during which the dummy voltage is applied in the precharge period of the previous program loop by a preset value. In this case, the increment in the time Pre_T during which the dummy voltage is applied may be constant.

In other examples, the time during which the dummy voltage is applied in the precharge period of the current program loop may be increased from the time during which the dummy voltage is applied in the precharge period of the previous program loop by a preset ratio. In this case, the increment in the time Pre_T during which the dummy voltage is applied may be increased according to the preset ratio.

In an embodiment, the magnitudes of the first to third dummy voltages V_dm1 to V_dm3 may be equal to each other. In other embodiments, the magnitudes of the first to third dummy voltages V_dm1 to V_dm3 may be increased depending on the magnitude of the program voltage.

FIG. 12 is a diagram for describing an operation of changing at least one of the magnitude of a precharge voltage, the time during which the precharge voltage is applied, the magnitude of a dummy voltage, and the time during which the dummy voltage is applied depending on the magnitude of a program voltage in a program operation of a memory device according to an embodiment of the present disclosure.

In FIG. 12, the horizontal axis of each of graphs indicates time. Also, the vertical axis of the graph in the upper portion of the drawing indicates the magnitude of a precharge voltage Vpre applied to a common source line, and the vertical axis of the graph in the lower portion of the drawing indicates the magnitude of a dummy voltage V_dm applied to dummy word lines.

In FIG. 12, descriptions of components the same as those in FIGS. 10A to 11B will be omitted.

Referring to FIG. 12, the memory device 100 may apply a first precharge voltage Vpre1 to the common source line for a first precharge time Pre_T1 in the precharge period of an n−2-th program loop PLn−2. The memory device 100 may apply a first dummy voltage V_dm1 to dummy word lines while applying the first precharge voltage Vpre1 to the common source line in the precharge period of the n−2-th program loop PLn−2.

Thereafter, the memory device 100 may apply a second precharge voltage Vpre2 to the common source line for a second precharge time Pre_T2, longer than the first precharge time Pre_T1, in the precharge period of an n−1-th program loop PLn−1. The memory device 100 may apply a second dummy voltage V_dm2 to the dummy word lines while applying the second precharge voltage Vpre2 to the common source line in the precharge period of the n−1-th program loop PLn−1. In an embodiment, the magnitude of the first precharge voltage Vpre1 may be equal to the magnitude of the second precharge voltage Vpre2. In other embodiments, the magnitude of the first dummy voltage V_dm1 may be equal to the magnitude of the second dummy voltage V_dm2.

Thereafter, the memory device 100 may apply a third precharge voltage Vpre3 to the common source line for a third precharge time Pre_T3, longer than the second precharge time Pre_T2, in the precharge period of the n-th program loop PLn. The memory device 100 may apply a third dummy voltage V_dm3 to the dummy word lines while applying the third precharge voltage Vpre3 to the common source line in the precharge period of the n-th program loop PLn.

In this case, the third precharge voltage Vpre3 may be a voltage higher than the second precharge Vpre2. Also, the third dummy voltage V_dm3 may be a voltage higher than the second dummy voltage V_dm2. In an example, the increment ΔVpre in the magnitude of the precharge voltage or the increment ΔV_dm in the magnitude of the dummy voltage may be set to any of various values in accordance with an embodiment. In other examples, the increment in the time during which the precharge voltage Vpre is applied or the increment in the time during which the dummy voltage V_dm is applied may be set to any of various values.

In an embodiment, as a selected word line coupled to selected memory cells is closer to the source select line or the common source line in the precharge period, the memory device 100 may change at least one of the magnitude of the precharge voltage Vpre to be applied to the common source line, the time during which the precharge voltage is applied, the magnitude of the dummy voltage V_dm to be applied to a plurality of dummy word lines, and the time during which the dummy voltage is applied, depending on the magnitude of the program voltage. In detail, as the selected word line coupled to selected memory cells is closer to the source select line or the common source line in the precharge period, the memory device 100 may increase at least one of the magnitude of the precharge voltage Vpre to be applied to the common source line, the time during which the precharge voltage is applied, the magnitude of the dummy voltage V_dm to be applied to a plurality of dummy word lines, and the time during which the dummy voltage is applied, depending on the preset reference value or the preset ratio.

Moreover, the memory device 100 may change at least one of the magnitude of the precharge voltage to be applied to the common source line, the time during which the precharge voltage is applied, the magnitude of the dummy voltage to be applied to the plurality of dummy word lines, and the time during which the dummy voltage is applied, in the precharge period of each of the plurality of program loops, without being limited to the embodiment described with reference to FIG. 12.

Figure 13:
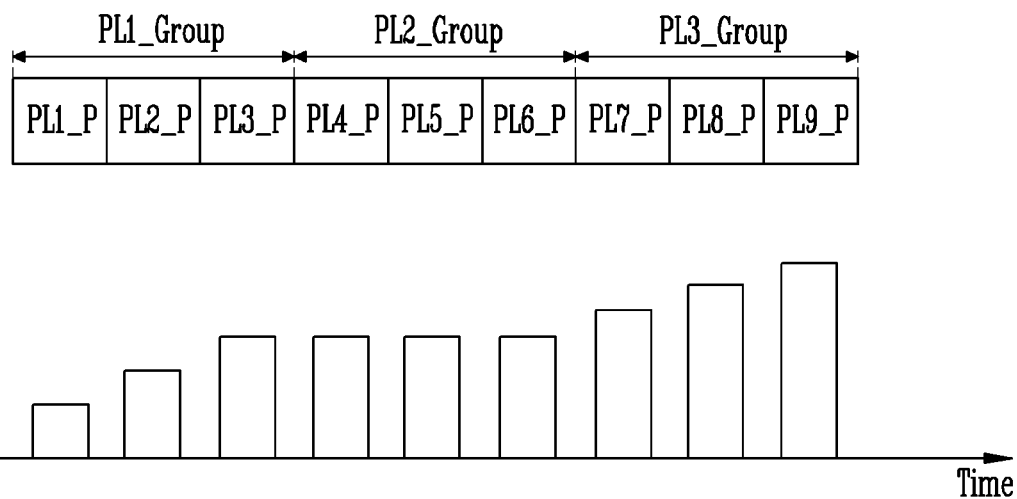
FIG. 13 is a diagram for describing an operation of changing a precharge voltage or a dummy voltage depending on a plurality of program loops in a program operation of a memory device according to an embodiment of the present disclosure.

FIG. 13 is a diagram for describing an operation of changing a precharge voltage or a dummy voltage depending on a plurality of program loops in a program operation of a memory device according to an embodiment of the present disclosure.

In FIG. 13, for convenience of description, first to ninth program loops PL1 to PL9 are performed during the program operation of the memory device. Also, in FIG. 13, only precharge periods PL1_P to PL9_P of each of the plurality of program loops are illustrated.

Referring to FIG. 13, the plurality of program loops PL1 to PL9 may include a plurality of first program loops PL1_Group, a plurality of second program loops PL2_Group, and a plurality of third program loops PL3_Group. In an embodiment, the plurality of first program loops PL1_Group may include precharge periods of first to third program loops PL1_P to PL3_P. The plurality of second program loops PL2_Group may include precharge periods of fourth to sixth program loops PL4_P to PL6_P. The plurality of third program loops PL3_Group may include precharge periods of seventh to ninth program loops PL7_P to PL9_P.

In an embodiment, the magnitude of the precharge voltage to be applied to a common source line or the magnitude of the dummy voltage to be applied to a plurality of dummy word lines in the precharge period of each of the plurality of first program loops PL1_Group may be increased according to a preset reference value or a preset ratio. The magnitude of the precharge voltage to be applied to the common source line or the magnitude of the dummy voltage to be applied to the plurality of dummy word lines in the precharge period of each of the plurality of second program loops PL2_Group may be constant. In an embodiment, the magnitude of the precharge voltage to be applied to the common source line or the magnitude of the dummy voltage to be applied to the plurality of dummy word lines in the precharge period of each of the plurality of third program loops PL3_Group may be increased according to a preset reference value or a preset ratio.

That is, in some of the plurality of program loops PL1 to PL9, the magnitude of the precharge voltage to be applied to the common source line or the magnitude of the dummy voltage to be applied to the plurality of dummy word lines may be increased according to a preset reference value or a preset ratio. Unlike this example, in some others of the plurality of program loops PL1 to PL9, the magnitude of the precharge voltage to be applied to the common source line or the magnitude of the dummy voltage to be applied to the plurality of dummy word lines may be constant.

Further, in some of the plurality of program loops PL1 to PL9, the time during which the precharge voltage is applied to the common source line or the time during which the dummy voltage is applied to the plurality of dummy word lines may be increased according to a preset reference value or a preset ratio. Unlike this example, in some others of the plurality of program loops PL1 to PL9, the time during which the precharge voltage is applied to the common source line or the time during which the dummy voltage is applied to the plurality of dummy word lines may be constant.

Figure 14:
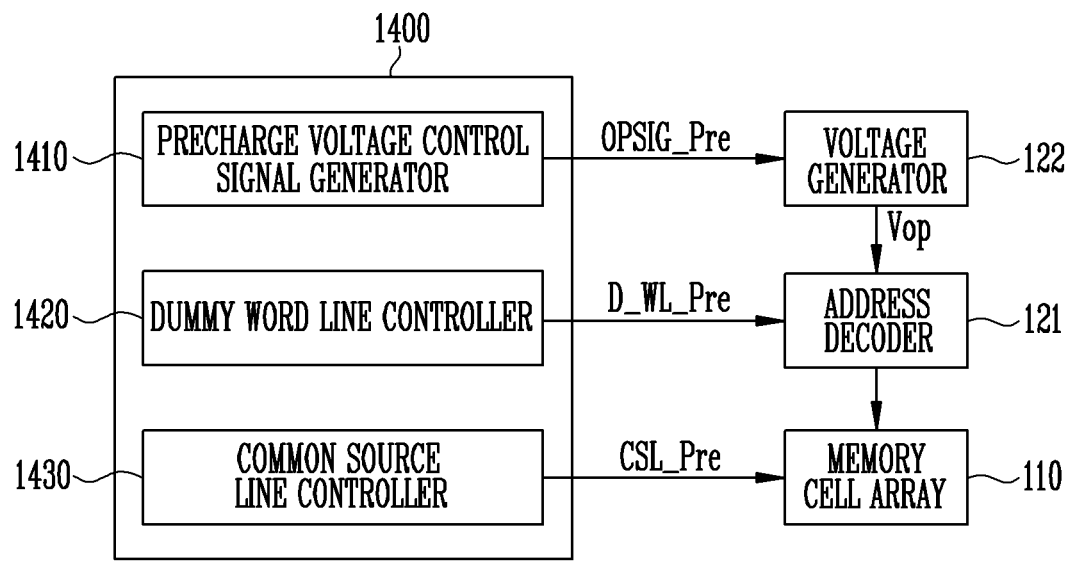
FIG. 14 is a diagram illustrating a control logic of FIG. 2 according to an embodiment of the present disclosure.

FIG. 14 is a diagram illustrating an embodiment of the control logic of FIG. 2 according to an embodiment of the present disclosure.

Referring to FIG. 14, the memory device 100 of FIG. 2 may include a memory cell array 110, an address decoder 121, a voltage generator 122, and a control logic 1400. The memory cell array 110, the address decoder 121, and the voltage generator 122 may be configured and operated in the same manner as the memory cell array 110, the address decoder 121, and the voltage generator 122, respectively, illustrated in FIG. 2. The control logic 1400 may be implemented as one component of the control logic 130 illustrated in FIG. 2.

The control logic 1400 may include a precharge voltage control signal generator 1410, a dummy word line controller 1420, and a common source line controller 1430.

The precharge voltage control signal generator 1410 may generate a program voltage control signal for instructing generation of a plurality of voltages to be used at a program operation. For example, the precharge voltage control signal generator 1410 may generate a precharge voltage control signal OPSIG_Pre to generate precharge-related voltages, which are voltages at various levels used in the precharge period, and may provide the generated precharge voltage control signal OPSIG_Pre to the voltage generator 122. The voltage generator 122 may generate various precharge-related voltages Vop to be used in the precharge period in response to the precharge voltage control signal OPSIG_Pre, and may provide the generated precharge-related voltages Vop to the address decoder 121.

The dummy word line controller 1420 may control the dummy voltage to be applied to the plurality of dummy word lines. The dummy word line controller 1420 may provide a dummy word line control signal D_WL_Pre for applying the dummy voltage to the plurality of dummy word lines to the address decoder 121. The address decoder 121 may provide the precharge-related voltages Vop, generated by the voltage generator 122, to the memory cell array 110 in response to the dummy word line control signal D_WL_Pre.

The common source line controller 1430 may control the precharge voltage to be applied to the common source line. In an embodiment, the common source line controller 1430 may apply a precharge voltage CSL_Pre to the common source line of the memory cell array 110.

Figure 15:
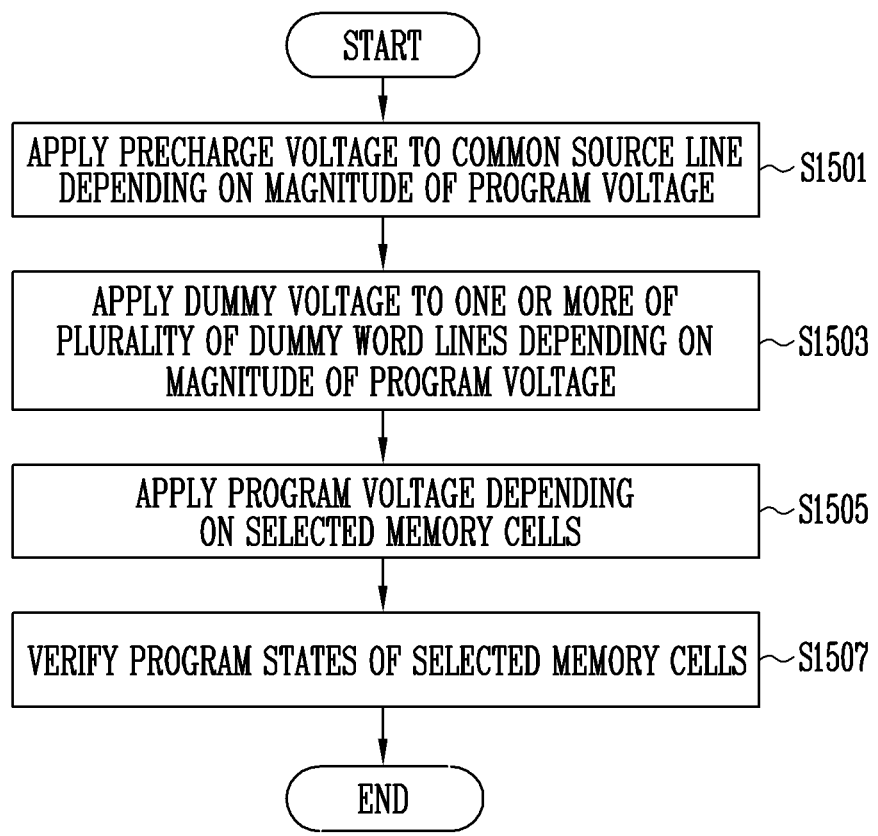
FIG. 15 is a flowchart illustrating a program operation of a memory device according to an embodiment of the present disclosure.

FIG. 15 is a flowchart illustrating the program operation of the memory device according to an embodiment of the present disclosure.

Referring to FIG. 15, at operation S1501, the memory device 100 may apply a precharge voltage to a common source line depending on the magnitude of the program voltage applied to a selected word line. The memory device 100 may vary the magnitude of the precharge voltage depending on the magnitude of the program voltage applied to the selected word line, and may then apply the precharge voltage to the common source line. For example, the memory device 100 may increase the magnitude of the precharge voltage to be applied to the common source line as the magnitude of the program voltage is increased while performing a plurality of program loops. Also, the memory device 100 may increase the time during which the precharge voltage is applied to the common source line as the magnitude of the program voltage is increased.

At operation S1503, the memory device 100 may apply a dummy voltage to one or more of a plurality of dummy word lines depending on the magnitude of the program voltage. The memory device 100 may vary the magnitude of the dummy voltage depending on the magnitude of the program voltage applied to the selected word line, and may then apply the dummy voltage to the one or more dummy word lines. For example, the memory device 100 may increase the magnitude of the dummy voltage to be applied to the one or more dummy word lines as the magnitude of the program voltage is increased while performing a plurality of program loops. Further, the memory device 100 may increase the time during which the dummy voltage is applied to the one or more dummy word lines as the magnitude of the program voltage is increased.

At operation S1505, the memory device 100 may apply the program voltage to selected memory cells.

At operation S1507, the memory device 100 may verify the program states of selected memory cells. For example, the memory device 100 may apply a verify voltage to the selected memory cells.

Figure 16:
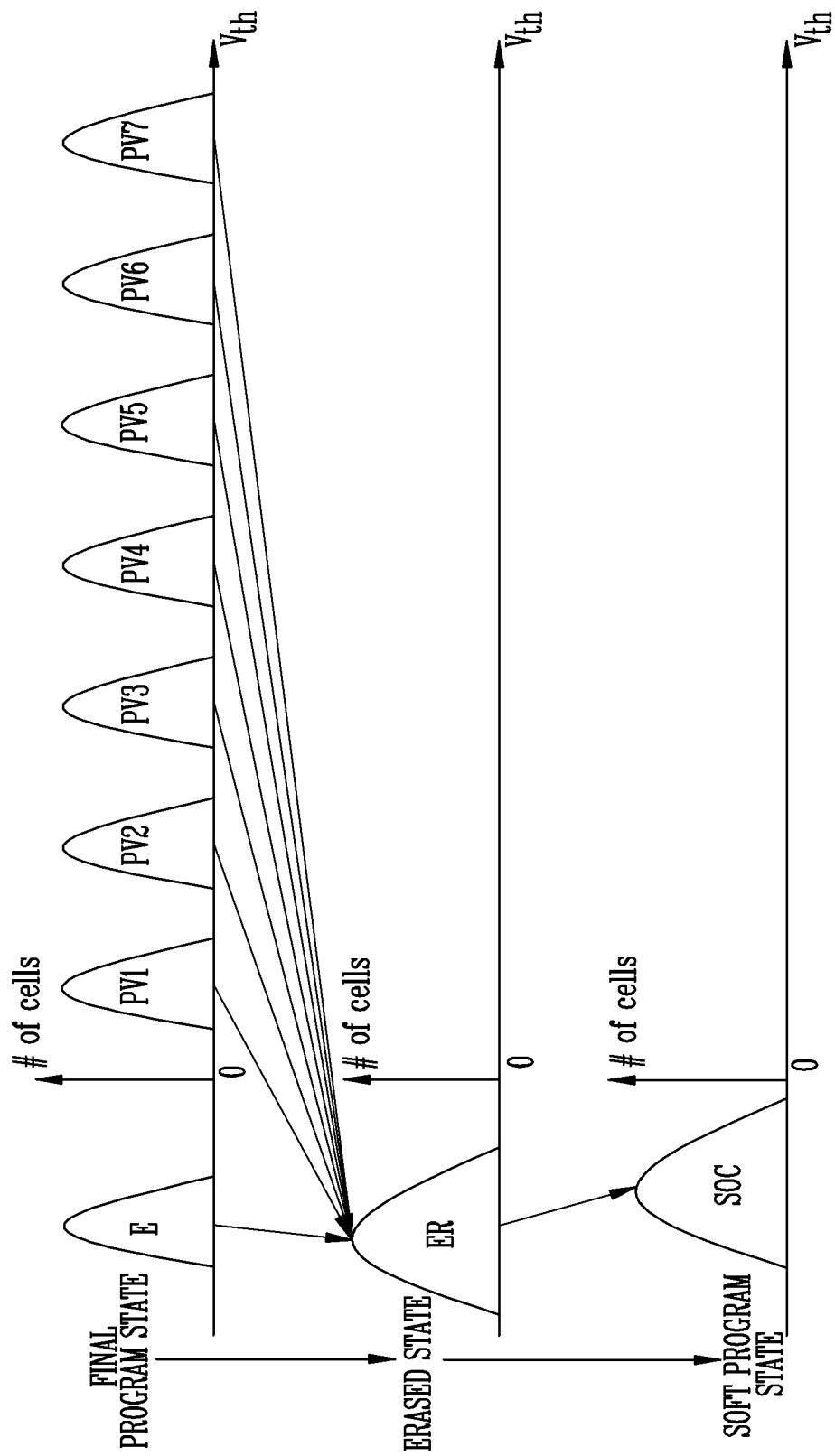
FIG. 16 is a diagram for describing an erase operation performed on a plurality of memory cells according to an embodiment of the present disclosure.

FIG. 16 is a diagram for describing an erase operation performed on a plurality of memory cells according to an embodiment of the present disclosure.

In FIG. 16, the horizontal axis of a graph indicates threshold voltages $V_{th}$ of the memory cells, and the vertical axis thereof indicates the number of memory cells (# of cells).

Referring to FIG. 16, the threshold voltages of a plurality of memory cells for which a program operation has been completed may have a final program state. The final program state may include a plurality of program states. The plurality of program states may be designated depending on the number of data bits stored in one memory cell. For example, when data is programmed in a triple-level cell (TLC) scheme in which three bits of data are stored in one memory cell, the plurality of program states may indicate an initial state E and first to seventh program states PV1 to PV7. After the program operation has been performed, the threshold voltages of the plurality of memory cells may be determined depending on the data to be stored in the memory cells. Each of the memory cells may have one of the plurality of program states as a target program state depending on the data to be stored in the corresponding memory cell. In FIG. 16, a description will be made based on the plurality of memory cells are programmed in a TLC scheme.

Each of the memory cells for which the program operation has been completed may have a threshold voltage corresponding to one of the initial state E and the first to seventh program states PV1 to PV7. Thereafter, the memory device 100 may perform an erase operation on the plurality of memory cells for which the program operation has been completed. The erase operation may be an operation of erasing the data stored in the plurality of memory cells. In detail, the erase operation may be an operation of decreasing the threshold voltages of the plurality of memory cells to an erased state ER. For example, the threshold voltages of the plurality of memory cells, each programmed to have a threshold voltage corresponding to one of the initial state E and the first to seventh program states PV1 to PV7, may be decreased to the threshold voltage corresponding to the erased state ER during the erase operation.

Here, since the characteristics of respective memory cells are different from each other, the degrees to which the threshold voltages of the plurality of memory cells are decreased during the erase operation may differ from each other. For example, during an erase operation on memory cells having threshold voltages corresponding to the first program state PV1, the degrees to which the threshold voltages of the memory cells are decreased to those corresponding to the erased state ER may differ from each other for respective memory cells. That is, because there are memory cells, the threshold voltages of which are greatly decreased during the erase operation on the plurality of memory cells, a threshold voltage distribution corresponding to the erased state ER may be formed to be wide. Also, memory cells, the threshold voltages of which are greatly decreased compared to other memory cells during the erase operation on the plurality of memory cells, may be designated as "over-erased memory cells." Alternatively, memory cells having threshold voltages lower than a threshold voltage corresponding to the initial state E during an erase operation may be designated as "over-erased memory cells."

Thereafter, the memory device 100 may perform a soft program operation on the plurality of memory cells for which the erase operation has been completed. The soft program operation may be an operation of increasing the threshold voltages of the plurality of memory cells. In detail, the soft program operation may be an operation of increasing the threshold voltages of over-erased memory cells to a threshold voltage corresponding to the initial state E or more. For example, the memory device 100 may apply a soft program voltage to a word line coupled to the plurality of memory cells during the soft program operation. In detail, during the soft program operation, the threshold voltages of a plurality of memory cells, corresponding to the erased state ER, may be increased to the threshold voltages corresponding to a soft program state SOC.

Figure 17:
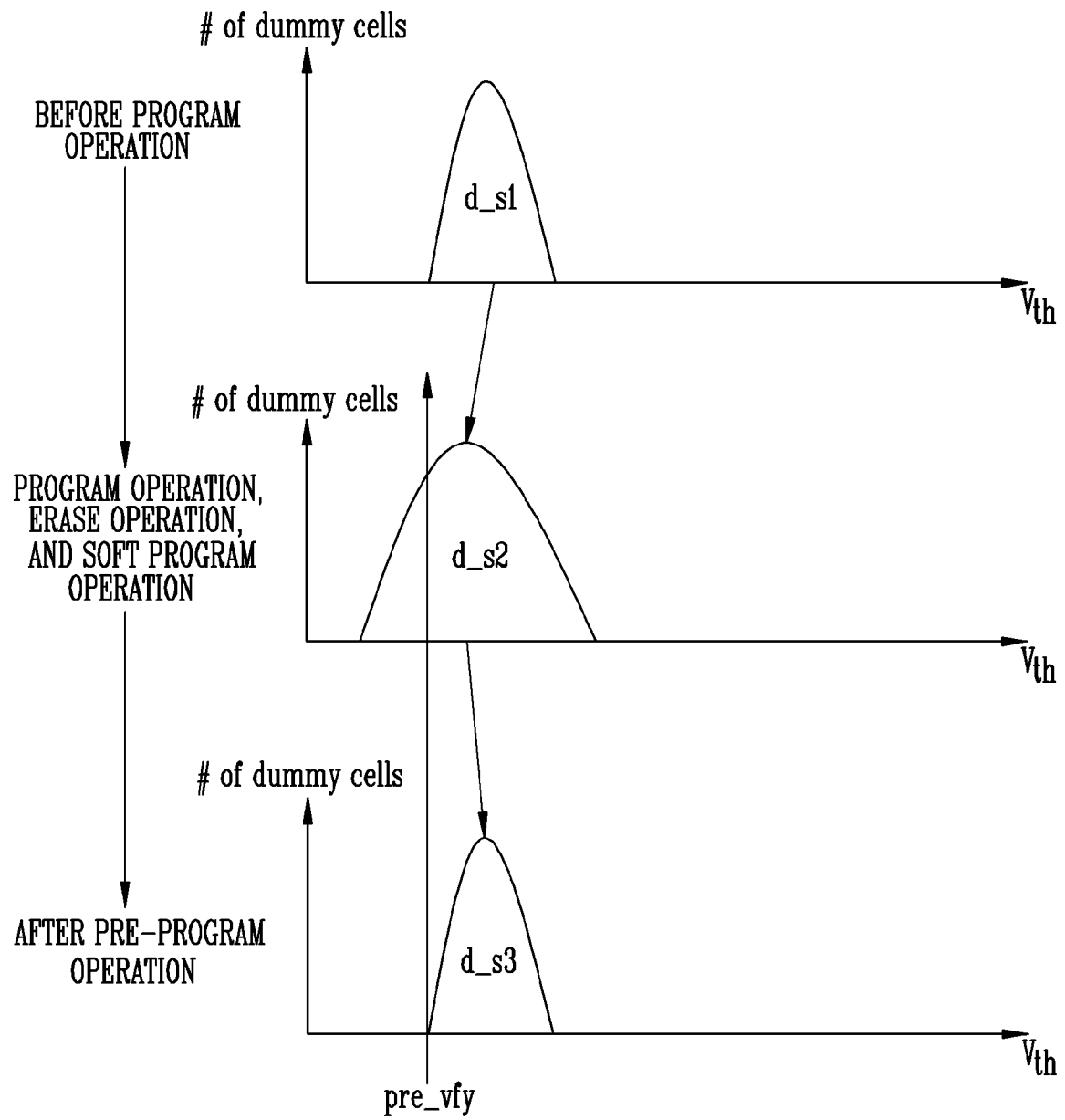
FIG. 17 is a diagram for describing a pre-program operation according to an embodiment of the present disclosure.

FIG. 17 is a diagram for describing a pre-program operation according to an embodiment of the present disclosure.

In FIG. 17, the horizontal axis of a graph indicates threshold voltages $V_{th}$ of dummy memory cells, and the vertical axis thereof indicates the number of dummy memory cells (# of cells).

The dummy memory cells may be dummy memory cells D_MC1 to D_MCl coupled between the memory cells MCl+1 to MCm and the source select line SSL, illustrated in FIG. 6. The dummy memory cells may be dummy memory cells D_MCm+1 to D_MCn coupled between the memory cells MCl+1 to MCm and the drain select line DSL, illustrated in FIG. 6.

Referring to FIG. 17, before a program operation on the plurality of memory cells is performed, the dummy memory cells may have threshold voltages corresponding to a first dummy state d_s1. Then, after the program operation, erase operation, and soft program operation are performed on the plurality of memory cells, the dummy memory cells may have threshold voltages corresponding to a second dummy state d_s2. The threshold voltages corresponding to the second dummy state d_s2 may have a threshold voltage distribution wider than that of the threshold voltages corresponding to the first dummy state d_s1. In detail, as described above with reference to FIGS. 10B and 11B, the threshold voltage distribution of dummy memory cells may be changed as the dummy voltage is applied to the plurality of dummy word lines in the precharge period of each of the plurality of program loops. Further, after the erase operation and the soft program operation are performed on the plurality of memory cells, the threshold voltage distribution of the dummy memory cells may be changed. That is, after the program operation, the erase operation, and the soft program operation are performed on the plurality of memory cells, the dummy memory cells may have a threshold voltage distribution wider than that before the program operation is performed on the plurality of memory cells.

Furthermore, after the threshold voltages of the dummy memory cells have changed from the threshold voltage distribution in the first dummy state d_s1 to the threshold voltage distribution in the second dummy state d_s2, the memory device 100 may perform a program operation on the plurality of memory cells. Here, during the precharge period of each of the plurality of program loops included in the program operation, the dummy voltage may be applied to the dummy word line coupled to the dummy memory cells. However, as the threshold voltage distribution of the dummy memory cells is widened, the number of dummy memory cells having threshold voltages lower than the dummy voltage may increase. That is, because the number of dummy memory cells that are turned on when the dummy voltage is applied is decreased, a channel potential may not rise in proportion to the applied dummy voltage.

Accordingly, the memory device 100 may perform a pre-program operation on the dummy memory cells to adjust the threshold voltage distribution of the dummy memory cells. The pre-program operation may be an operation of identifying the threshold voltages of the dummy memory cells using a pre-verify voltage and performing a plurality of pre-program loops on first dummy memory cells having threshold voltages less than or equal to the pre-verify voltage, among the dummy memory cells. Each of the plurality of pre-program loops may include a pre-program voltage application operation of increasing the threshold voltages of the first dummy memory cells and a pre-verify operation of identifying the threshold voltages of the first dummy memory cells.

The memory device 100 may perform a pre-program operation on the dummy memory cells and thereafter perform a program operation on a plurality of memory cells, thus adjusting the channel potential so that the channel potential rises in proportion to the dummy voltage applied to the dummy word line during the precharge period.

In an embodiment, the memory device 100 may determine whether to perform a pre-program operation depending on the position of the selected word line coupled to memory cells selected from among the plurality of memory cells. In detail, when the position of the selected word line is a first word line of a memory block including the selected word line, a pre-program operation is performed on the dummy memory cells, and thereafter a program operation may be performed on the selected memory cells.

Referring to the graph in the center portion of FIG. 17, the memory device 100 may terminate a program operation, an erase operation, and a soft program operation performed on the plurality of memory cells, and thereafter identify the threshold voltages of the dummy memory cells using a pre-verify voltage pre_vfy. In detail, the memory device 100 may perform a plurality of pre-program loops on the first dummy memory cells having threshold voltages less than or equal to the pre-verify voltage pre_vfy, among the dummy memory cells. Also, after the plurality of pre-program loops have been performed, the dummy memory cells may have threshold voltages greater than the pre-verify voltage pre_vfy. The threshold voltages greater than the pre-verify voltage pre_vfy may have a threshold voltage distribution corresponding to a third dummy state d_s3. The threshold voltage distribution of the dummy memory cells may be changed from the second dummy state d_s2 to the third dummy state d_s3 by performing the plurality of pre-program loops on the first dummy memory cells. That is, the threshold voltage distribution of the dummy memory cells may be formed to be narrow by performing a plurality of pre-program loops on the first dummy memory cells.

Figure 18:
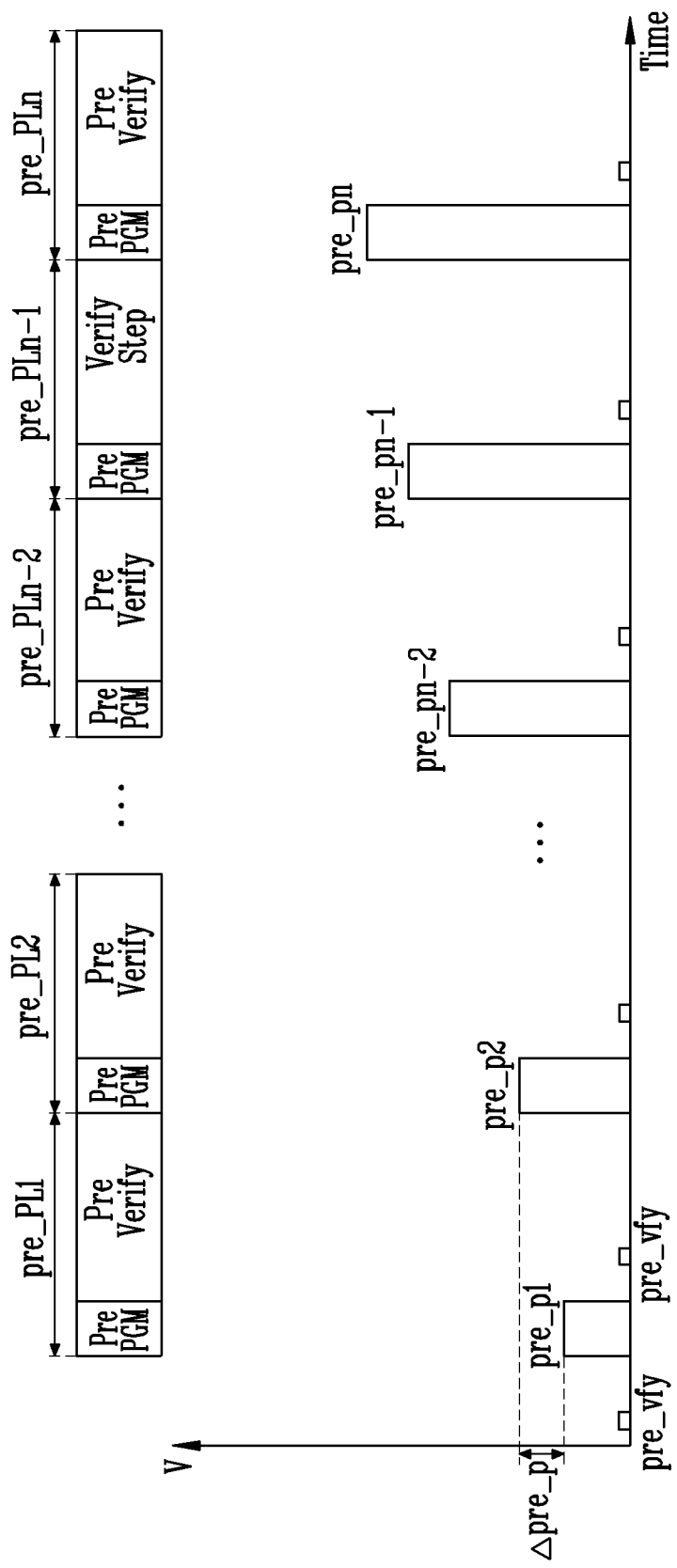
FIG. 18 is a diagram for describing a pre-program operation including a plurality of pre-program loops according to an embodiment of the present disclosure.

FIG. 18 is a diagram for describing a pre-program operation including a plurality of pre-program loops according to an embodiment of the present disclosure.

In FIG. 18, the horizontal axis of a graph indicates time and the vertical axis thereof indicates the voltage V applied to dummy word lines.

Referring to FIG. 18, the pre-program operation may include an operation of identifying the threshold voltages of dummy memory cells using a pre-verify voltage pre_vfy and a plurality of pre-program loops pre_PL1 to pre_PLn. Each of the plurality of pre-program loops pre_PL1 to pre_PLn may include a pre-program voltage application operation (Pre PGM) and a pre-verify operation (Pre Verify).

The pre-program voltage application operation (Pre PGM) may be an operation of applying a pre-program voltage pre_p to dummy word lines coupled to dummy memory cells. In detail, the pre-program voltage application operation (Pre PGM) may be an operation of increasing the threshold voltages of first dummy memory cells using the pre-program voltage pre_p. The pre-verify operation (Pre Verify) may be an operation of applying a pre-verify voltage pre_vfy to dummy word lines coupled to the dummy memory cells. In detail, the pre-verify operation (Pre Verify) may be an operation of identifying the threshold voltages of the first dummy memory cells using the pre-verify voltage pre_vfy.

In an embodiment, the memory device 100 may identify the first dummy memory cells having threshold voltages less than or equal to the pre-verify voltage pre_vfy, among the dummy memory cells. Thereafter, the memory device 100 may perform a plurality of pre-program loops on the first dummy memory cells.

In an embodiment, the memory device 100 may apply a first pre-program voltage pre_p1 to the dummy word lines coupled to dummy memory cells during the pre-program voltage application operation (Pre PGM) of the first pre-program loop pre_PL1. The magnitude of the first pre-program voltage pre_p1 may be less than that of the first program voltage Vpgm1 illustrated in FIG. 7. Here, the memory device 100 may apply a pre-program enable voltage to the bit line coupled to the first dummy memory cells. The pre-program enable voltage may be a ground voltage. The memory device 100 may apply a pre-program inhibit voltage to bit lines coupled to the remaining dummy memory cells other than the first dummy memory cells, among the dummy memory cells. The pre-program inhibit voltage may be a supply voltage.

Thereafter, the memory device 100 may apply the pre-verify voltage pre_Vfy to the dummy word lines coupled to the dummy memory cells during the pre-verify operation (Pre Verify) of the first pre-program loop pre_PL1. Here, when the threshold voltages of the first dummy memory cells are greater than the pre-verify voltage pre_vfy, the pre-program operation may be terminated. However, when the first dummy memory cells have threshold voltages less than or equal to the pre-verify voltage pre_vfy, the second pre-program loop pre_PL2 may be performed.

The memory device 100 may apply a second pre-program voltage pre_p2 to the dummy word lines coupled to dummy memory cells during the pre-program voltage application operation (Pre PGM) of the second pre-program loop pre_PL2. The second pre-program voltage pre_p2 may be a voltage increased from the first pre-program voltage pre_p1 by a unit pre-voltage Δpre_p. The magnitude of the unit pre-voltage Δpre_p may be less than the magnitude of the unit voltage ΔVpgm illustrated in FIG. 7. Thereafter, the memory device 100 may perform the pre-verify operation (Pre Verify) of the second pre-program loop pre_PL2 in the same manner as the pre-verify operation (Pre Verify) of the first pre-program loop Pre_PL1.

Thereafter, the memory device 100 may perform a subsequent pre-program loop in the same manner as the second pre-program loop pre_PL2. When the threshold voltages of first dummy memory cells are greater than the pre-verify voltage pre_vfy, the memory device 100 may terminate the pre-program operation, and may perform a program operation on the plurality of memory cells.

In an embodiment, the pre-program voltage may be determined based on an incremental step pulse programming (ISPP) method. The level of the pre-program voltage may be increased or decreased by stages as the plurality of pre-program loops pre_PL1 to pre_PLn are repeated. The number of applications of pre-program voltages used in respective pre-program loops, the voltage levels of the pre-program voltages, voltage application times, etc. may be determined in various forms under the control of the memory controller 200.

Figure 19:
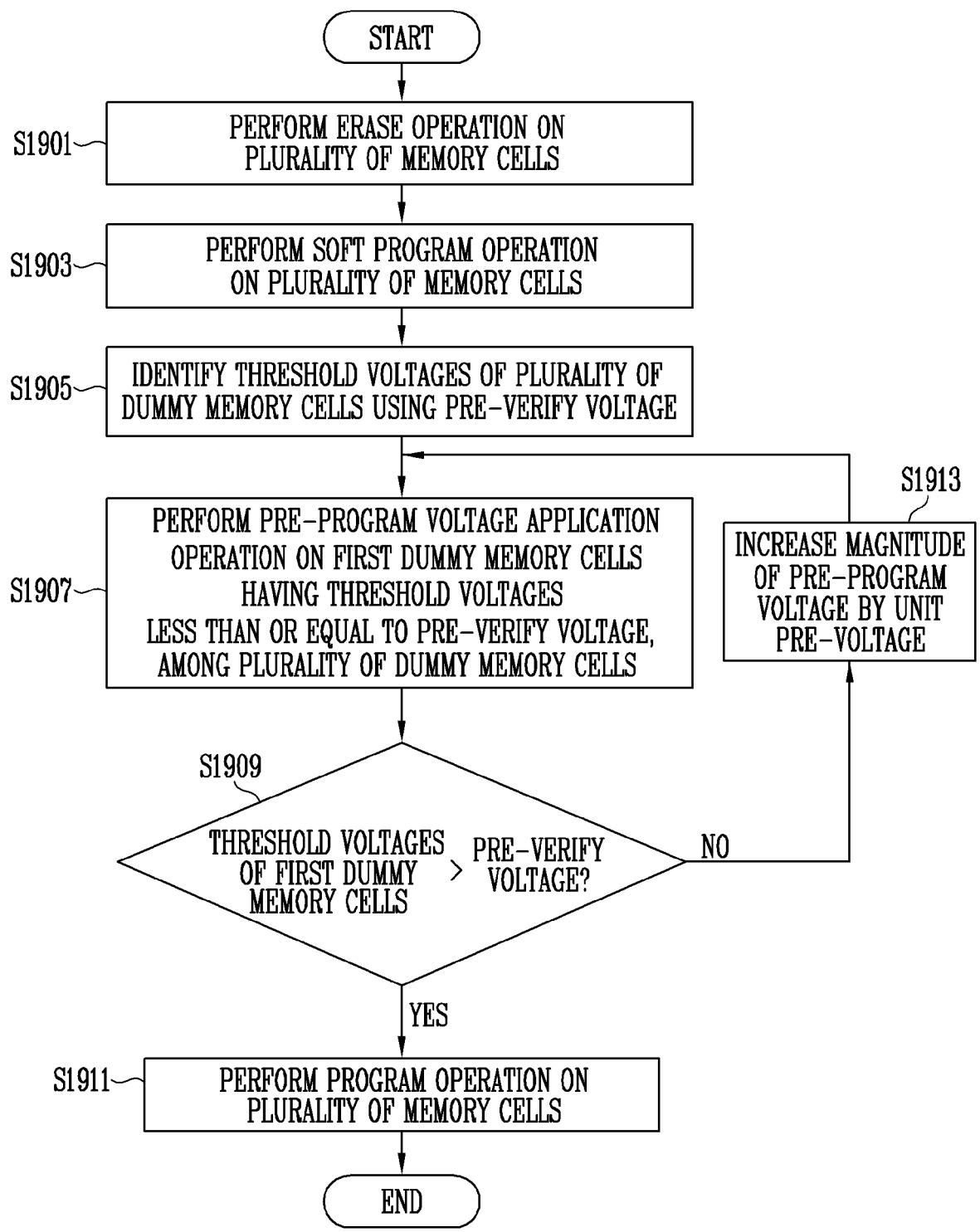
FIG. 19 is a flowchart illustrating a pre-program operation according to an embodiment of the present disclosure.

FIG. 19 is a flowchart illustrating a pre-program operation according to an embodiment of the present disclosure.

Referring to FIG. 19, at operation S1901, the memory device 100 may perform an erase operation on a plurality of memory cells. During the erase operation, threshold voltages of the plurality of memory cells may be decreased to an erased state.

At operation S1903, the memory device 100 may perform a soft program operation on the plurality of memory cells.

At operation S1905, the memory device 100 may identify the threshold voltages of a plurality of dummy memory cells using a pre-verify voltage. In an embodiment, the memory device 100 may identify the first dummy memory cells having threshold voltages less than or equal to the pre-verify voltage pre_vfy, among the dummy memory cells.

At operation S1907, the memory device 100 may perform a pre-program voltage application operation on the first dummy memory cells having threshold voltages less than or equal to the pre-verify voltage, among the plurality of dummy memory cells. During the pre-program voltage application operation, the threshold voltages of the first dummy memory cells may be increased.

At operation S1909, the memory device 100 may identify whether the threshold voltages of the first dummy memory cells are greater than the pre-verify voltage during a pre-verify operation. When the threshold voltages of the first dummy memory cells are greater than the pre-verify voltage, the process may proceed to operation S1911. In contrast, when the threshold voltages of the first dummy memory cells are less than or equal to the pre-verify voltage, the process may proceed to operation S1913.

At operation S1911, when the threshold voltages of the first dummy memory cells are greater than the pre-verify voltage pre_vfy, the memory device 100 may terminate the pre-program operation, and may perform a program operation on the plurality of memory cells.

At operation S1913, when the threshold voltages of the first dummy memory cells are less than or equal to the pre-verify voltage, the memory device 100 may increase the magnitude of the pre-program voltage by a unit pre-voltage. Thereafter, the memory device 100 may perform a pre-program voltage application operation on the first dummy memory cells using the pre-program voltage increased by the unit pre-voltage.

Figure 20:
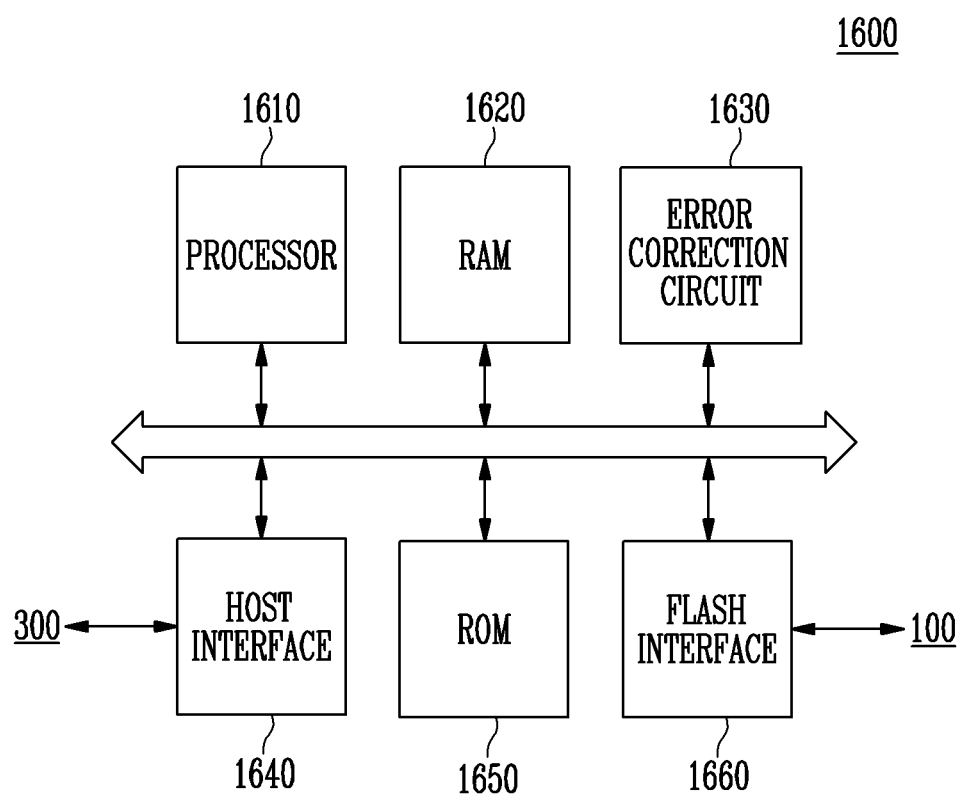
FIG. 20 is a diagram illustrating a memory controller of FIG. 1 according to an embodiment of the present disclosure.

FIG. 20 is a diagram illustrating the memory controller of FIG. 1 according to an embodiment of the present disclosure.

The memory controller 1600 of FIG. 20 may be the memory controller 200 of FIG. 1.

Referring to FIG. 20, the memory controller 1600 may include a processor 1610, a RAM 1620, an error correction circuit 1630, a host interface 1640, a ROM 1650, and a flash interface 1660.

The processor 1610 may control the overall operation of the memory controller 1600. The RAM 1620 may be used as a buffer memory, a cache memory or a working memory of the memory controller 1600.

The error correction circuit 1630 may perform error correction. The error correction circuit 1630 may perform error correction code (ECC) encoding based on data to be written to the memory device 100 through the flash interface 1660. The ECC-encoded data may be transferred to the memory device 100 through the flash interface 1660. The error correction circuit 1630 may perform error correction decoding (ECC decoding) on data received from the memory device 100 through the flash interface 1660. In an embodiment, the error correction circuit 1630 may be included, as a component of the flash interface 1660, in the flash interface 1660.

The ROM 1650 may store various types of information required for the operation of the memory controller 1600 in the form of firmware.

The memory controller 1600 may communicate with an external device (e.g., a host 300, an application processor or the like) through the host interface 1640.

The memory controller 1600 may communicate with the memory device 100 through the flash interface 1660. The memory controller 1600 may transmit a command, an address, a control signal, etc. to the memory device 100 and receive data from the memory device 100, through the flash interface 1660. In an example, the flash interface 1660 may include a NAND interface.

Figure 21:
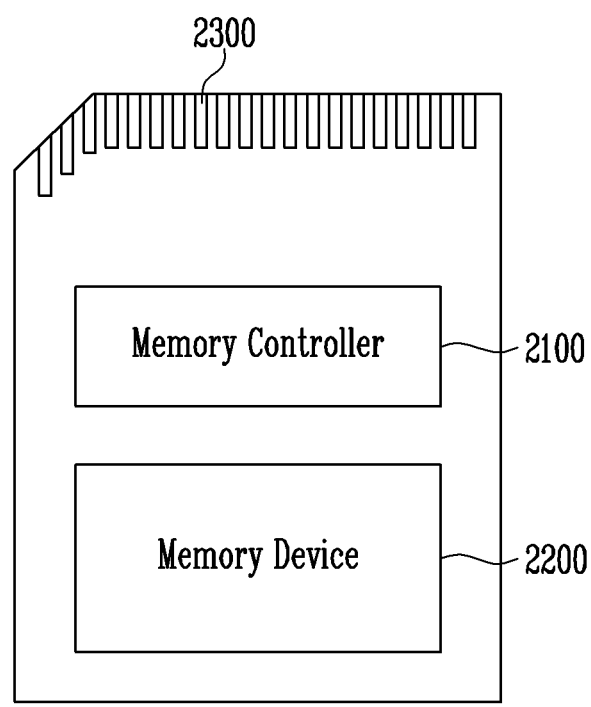
FIG. 21 is a block diagram illustrating a memory card system to which a memory system according to an embodiment of the present disclosure is applied.

FIG. 21 is a block diagram illustrating a memory card system to which a memory system according to an embodiment of the present disclosure is applied.

Referring to FIG. 21, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same manner as the memory controller 200, described above with reference to FIG. 1. The memory device 2200 may be implemented in the same manner as the memory device 100, described above with reference to FIG. 1.

In an embodiment, the memory controller 2100 may include components, such as a RAM, a processor, a host interface, a memory interface, and an error correction circuit.

The memory controller 2100 may communicate with an external device through the connector 2300. The memory controller 2100 may communicate with an external device (e.g., a host) based on a specific communication standard or protocol. In an embodiment, the memory controller 2100 may communicate with the external device through at least one of various communication standards or interfaces such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe). In an embodiment, the connector 2300 may be defined by at least one of the above-described various communication standards or interfaces.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin Transfer Torque magnetic RAM (STT-MRAM).

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 22:
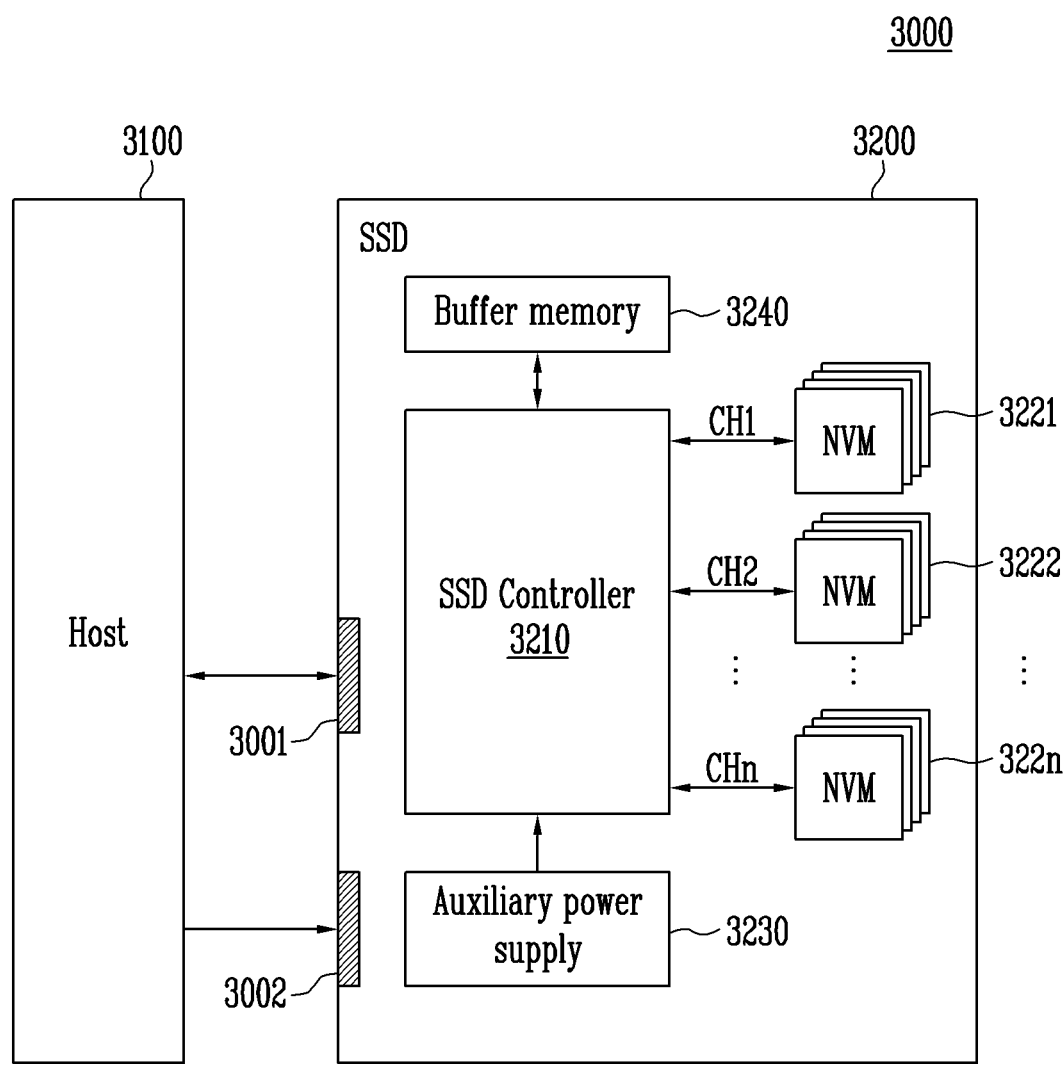
FIG. 22 is a block diagram illustrating a solid state drive (SSD) system to which a memory system according to an embodiment of the present disclosure is applied.

FIG. 22 is a block diagram illustrating a solid state drive (SSD) system to which a memory system according to an embodiment of the present disclosure is applied.

Referring to FIG. 22, an SSD system 3000 may include a host 3100 and an SSD 3200. The SSD 3200 may exchange signals with the host 3100 through a signal connector 3001 and may receive power through a power connector 3002. The SSD 3200 may include an SSD controller 3210, a plurality of flash memories 3221 to 322n, an auxiliary power supply 3230, and a buffer memory 3240.

In accordance with an embodiment of the present disclosure, the SSD controller 3210 may perform the function of the memory controller 200 described above with reference to FIG. 1.

The SSD controller 3210 may control the plurality of flash memories 3221 to 322n in response to the signals received from the host 3100. In an embodiment, the signals may be signals based on the interfaces of the host 3100 and the SSD 3200. For example, the signals may be signals defined by at least one of various communication standards or interfaces such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe).

The auxiliary power supply 3230 may be coupled to the host 3100 through the power connector 3002. The auxiliary power supply 3230 may be supplied with power from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 23:
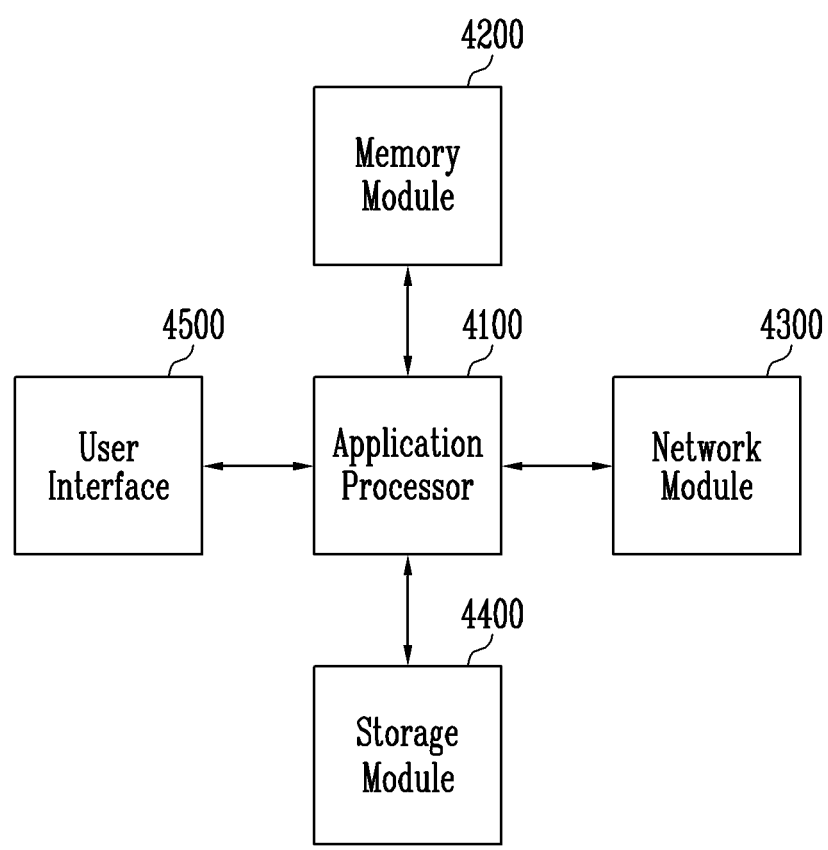
FIG. 23 is a block diagram illustrating a user system to which a memory system according to an embodiment of the present disclosure is applied.

FIG. 23 is a block diagram illustrating a user system to which a memory system according to an embodiment of the present disclosure is applied.

Referring to FIG. 23, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same manner as the memory device 100 described above with reference to FIG. 1. The storage module 4400 may be operated in the same manner as the memory system 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there are provided a memory device for performing a program operation, which can improve a disturbance phenomenon occurring during the program operation, and a method of operating the memory device.

Example embodiments have been disclosed herein, and although specific terms are employed, the embodiments are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims. Furthermore, the embodiments may be combined to form additional embodiments.

What is claimed is:

1. A memory device comprising:
    a plurality of memory cells coupled between a common source line and a bit line;
    a peripheral circuit configured to perform a plurality of program loops, each including a program voltage application operation of applying a program voltage to a memory cell selected from among the plurality of memory cells and a verify operation of verifying a program state of the selected memory cell; and
    a control logic configured to control, at the program voltage application operation, the peripheral circuit to:
    apply a precharge voltage to the common source line, and
    change at least one of a magnitude of the precharge voltage and a time during which the precharge voltage is applied to the common source line, depending on a magnitude of the program voltage.

2. The memory device according to claim 1, wherein the control logic is configured to control the peripheral circuit to apply the precharge voltage to the common source line in partial program loops starting from a preset program loop among the plurality of program loops.

3. The memory device according to claim 1,
    wherein the peripheral circuit is configured to apply the program voltage having different magnitudes in the respective program loops, and
    wherein the control logic is configured to control the peripheral circuit to increase a magnitude of the program voltage as the program loops proceed, and to increase, as the magnitude of the program voltage is increased, at least one of the magnitude of the precharge voltage and the time during which the precharge voltage is applied.

4. The memory device according to claim 3, wherein an increment of the at least one of the magnitude of the precharge voltage and the time during which the precharge voltage is applied is increased according to a preset reference value or a preset ratio.

5. The memory device according to claim 1, wherein the control logic is configured to control the peripheral circuit to increase, as the selected memory cell is closer to the common source line, at least one of the magnitude of the precharge voltage and the time during which the precharge voltage is applied.

6. The memory device according to claim 1,
    wherein each of the plurality of program loops comprises a plurality of first program loops and a plurality of second program loops,
    wherein the control logic controls the peripheral circuit to change, at the program voltage application operation in each of the plurality of first program loops, at least one of the magnitude of the precharge voltage and the time during which the precharge voltage is applied to the common source line, and
    wherein the control logic controls the peripheral circuit to maintain, at the program voltage application operation in each of the plurality of second program loops, the magnitude of the precharge voltage and the time during which the precharge voltage is applied to the common source line.

7. A memory device, comprising:
    a plurality of memory cell strings, each including a plurality of memory cells coupled between a common source line and a bit line, and a plurality of dummy memory cells coupled between the plurality of memory cells and the common source line;
a peripheral circuit configured to perform a plurality of program loops, each program loop including a program voltage application operation of applying a program voltage to a memory cell selected from among the plurality of memory cells and a verify operation of verifying program states of the selected memory cells; and
a control logic configured to control, at the program voltage application operation, the peripheral circuit to:
apply a precharge voltage to the common source line,
apply a dummy voltage to at least one of a plurality of dummy word lines respectively coupled to the plurality of dummy memory cells, and
change at least one of a magnitude of the dummy voltage and a time during which the dummy voltage is applied to the at least one dummy word line depending on a magnitude of the program voltage.

8. The memory device according to claim 7, wherein the control logic is configured to control the peripheral circuit to apply the dummy voltage to the at least one dummy word line in partial program loops starting from a preset program loop among the plurality of program loops.

9. The memory device according to claim 7,
wherein the peripheral circuit is configured to apply the program voltage having different magnitudes in the respective program loops, and
wherein the control logic is configured to control the peripheral circuit to increase a magnitude of the program voltage as the program loops proceed, and to increase, as the magnitude of the program voltage is increased, at least one of the magnitude of the dummy voltage and the time during which the dummy voltage is applied.

10. The memory device according to claim 7, wherein the control logic is configured to control the peripheral circuit to increase, as the selected memory cell is closer to the common source line, at least one of the magnitude of the dummy voltage and the time during which the dummy voltage is applied.

11. The memory device according to claim 7, wherein the dummy memory cell coupled to the at least one dummy word line is closest to the plurality of memory cells among the plurality of dummy memory cells.

12. The memory device according to claim 7,
wherein the peripheral circuit is further configured to perform, before the program loops, an erase operation of erasing data stored in the plurality of memory cells, and
wherein the control logic is configured to control, after the erase operation, the peripheral circuit to:
identify, before the program loops, threshold voltages of the plurality of dummy memory cells using a pre-verify voltage, and
perform a plurality of pre-program loops on first dummy memory cells having threshold voltages less than or equal to the pre-verify voltage among the plurality of dummy memory cells.

13. The memory device according to claim 12, wherein each of the plurality of pre-program loops comprises:
a pre-program voltage application operation of increasing threshold voltages of the first dummy memory cells using a pre-program voltage, and
a pre-verify operation of identifying threshold voltages of the first dummy memory cells using the pre-verify voltage.

14. The memory device according to claim 13, wherein the control logic is configured to control the peripheral circuit to perform, when dummy memory cells having threshold voltages less than or equal to the pre-verify voltage are present among the first dummy memory cells in one of the plurality of pre-program loops, a subsequent pre-program loop.

15. The memory device according to claim 14, wherein the control logic is configured to control the peripheral circuit further to increase a magnitude of the pre-program voltage by a unit pre-voltage as the pre-program loops proceed.

16. The memory device according to claim 14, wherein the control logic is configured to control the peripheral circuit further to end, when the threshold voltages of the first dummy memory cells are greater than the pre-verify voltage, the pre-program loops to perform the plurality of program loops.

17. The memory device according to claim 7,
wherein each of the plurality of memory cell strings further includes second dummy memory cells coupled between the plurality of memory cells and the bit line,
wherein the peripheral circuit is further configured to perform, before the program loops, an erase operation of erasing data stored in the plurality of memory cells, and
wherein the control logic is configured to control, after the erase operation is terminated, the peripheral circuit to:
identify, before the program loops, threshold voltages of the second dummy memory cells using a pre-verify voltage, and
perform a plurality of pre-program loops on second dummy memory cells having threshold voltages less than or equal to the pre-verify voltage among the second dummy memory cells.

18. A method of operating a memory device including a plurality of memory cell strings each including a plurality of memory cells coupled between a common source line and a bit line, a source select transistor coupled to a source select line between the common source line and the plurality of memory cells, a drain select transistor coupled to a drain select line between the bit line and the plurality of memory cells, and a plurality of dummy memory cells coupled between the plurality of memory cells and the source select transistor, the method comprising:
applying a first precharge voltage to the common source line in a first program loop among a plurality of program loops;
applying a first dummy voltage to at least one of a plurality of dummy word lines respectively coupled to the plurality of dummy memory cells in the first program loop;
applying a second precharge voltage higher than the first precharge voltage to the common source line in a second program loop after the first program loop among the plurality of program loops; and
applying a second dummy voltage higher than the first dummy voltage to the at least one dummy word line in the second program loop.

19. The method according to claim 18, further comprising performing the plurality of program loops each including applying a program voltage to a memory cell selected from among the plurality of memory cells,
wherein a magnitude of the program voltage increases as the program loops proceed.

20. The method according to claim 19,
wherein the applying the second precharge voltage comprises applying the second precharge voltage for a time longer than a time during which the first precharge voltage is applied to the common source line, and
wherein the applying the second dummy voltage comprises applying the second dummy voltage for a time longer than a time during which the first dummy voltage is applied to the at least one dummy word line.

* * * * *